United States Patent [19]

Kohiki et al.

[11] Patent Number: 5,145,830
[45] Date of Patent: Sep. 8, 1992

[54] METHOD FOR MANUFACTURING THIN FILM OXIDE SUPERCONDUCTORS AND SUPERCONDUCTOR DEVICES BY X-RAY IRRADIATION

[75] Inventors: Shigemi Kohiki, Osaka; Akira Enokihara, Ikoma; Hidetaka Higashino, Matsubara; Shinichiro Hatta, Hirakata; Kentaro Setsune, Sakai; Kiyotaka Wasa, Nara; Takeshi Kamada, Ikeda; Shigenori Hayashi, Neyagawa, all of Japan

[73] Assignee: Matsushita Electric Industrial Co., Ltd., Osaka, Japan

[21] Appl. No.: 571,095

[22] Filed: Aug. 21, 1991

[30] Foreign Application Priority Data

| Aug. 21, 1989 | [JP] | Japan | 1-214496 |
| Aug. 21, 1989 | [JP] | Japan | 1-214498 |
| Apr. 16, 1990 | [JP] | Japan | 2-99702 |
| Apr. 16, 1990 | [JP] | Japan | 2-99704 |
| Apr. 17, 1990 | [JP] | Japan | 2-101301 |
| May 31, 1990 | [JP] | Japan | 2-143104 |

[51] Int. Cl.$^5$ .......................... B05D 3/06; B05D 5/12
[52] U.S. Cl. ...................... 505/1; 505/701; 505/702; 505/727; 427/36; 427/38; 427/62; 427/63; 357/5; 365/161; 365/162
[58] Field of Search ............ 505/1, 701, 702, 703, 505/727; 365/161, 162; 427/62, 63, 36, 38, 39; 357/5, 4, 22, 23.1

[56] References Cited

FOREIGN PATENT DOCUMENTS

| 0317495 | 5/1989 | European Pat. Off. . |
| 0335556 | 10/1989 | European Pat. Off. . |
| 0392437 | 10/1990 | European Pat. Off. . |
| 63-279494 | 11/1988 | Japan . |
| 1-8683 | 1/1989 | Japan . |
| 1-20638 | 1/1989 | Japan . |
| 64-43916 | 2/1989 | Japan . |
| 1-7913 | 3/1989 | Japan . |
| 1-160898 | 6/1989 | Japan . |
| 1-239977 | 9/1989 | Japan . |
| 1-252567 | 10/1989 | Japan . |

OTHER PUBLICATIONS

"Ozone-UV Irradiation Effects On $Ba_2YCu_3O_{7-x}$ Thin Films", H. Tamura et al., Appl. Phys. Lett. vol. 52, No. 25, Jun. 20, 1988, pp. 2183-2185.

"Laser-Induced Formation and Surface Processing of High-Temperature Superconductors" D. Bauerle, Applied Physics A 48 (6) 527-542, (1989).

"X-Ray Irradiation Enhanced Critical Current Density and Strong Pinning Sites Created in $Gd_1Ba_2Cu_3O_{7-x}$ Thin Films", S. Kohiki et al., Appl. Phys. A. 50, 509-514 (1990).

*Primary Examiner*—Shrive Beck
*Assistant Examiner*—Roy V. King
*Attorney, Agent, or Firm*—Wenderoth, Lind & Ponack

[57] ABSTRACT

A manufacturing method for the thin film superconductor is disclosed in which photons having energies larger than ultraviolet rays are irradiated to the thin film superconductor on or after formation of the thin film. Further, manufacturing methods for superconductive magnetic memory, Josephson device and superconductive transistor are disclosed.

9 Claims, 13 Drawing Sheets

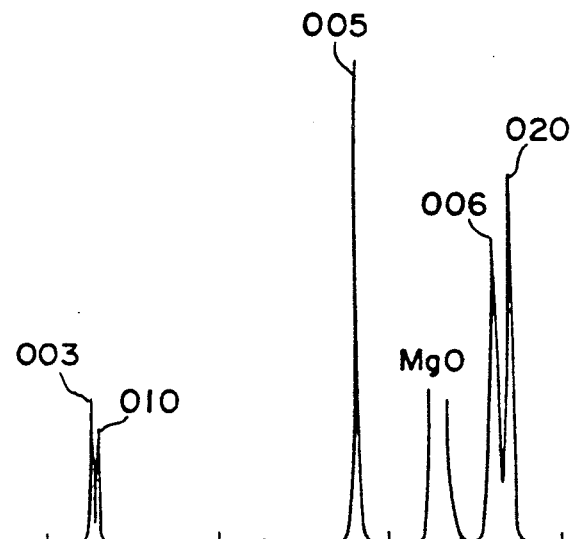
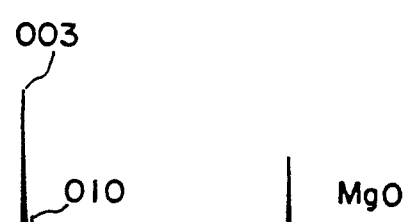

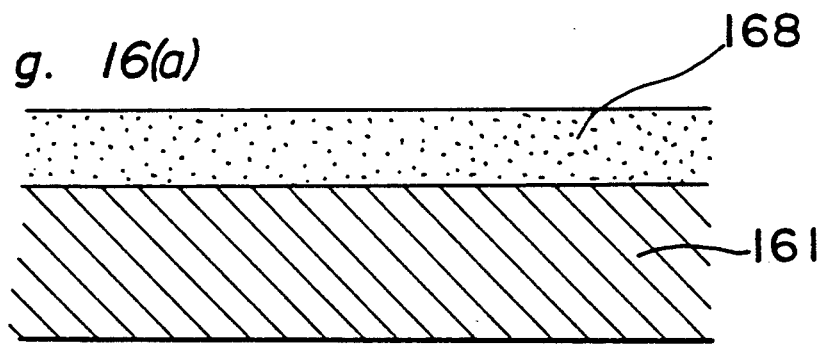
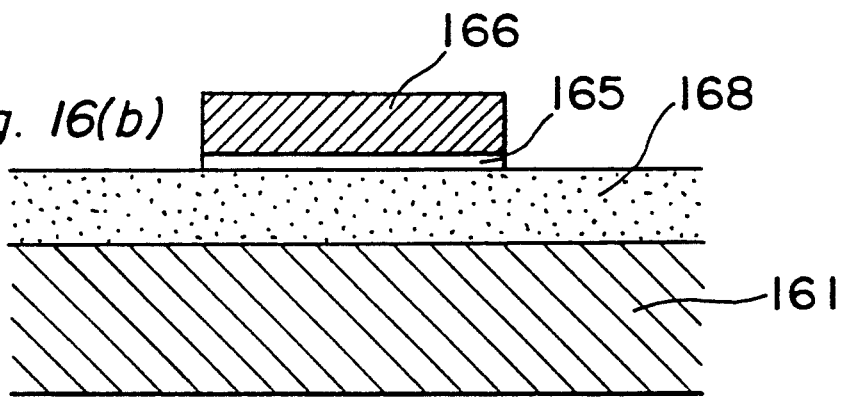
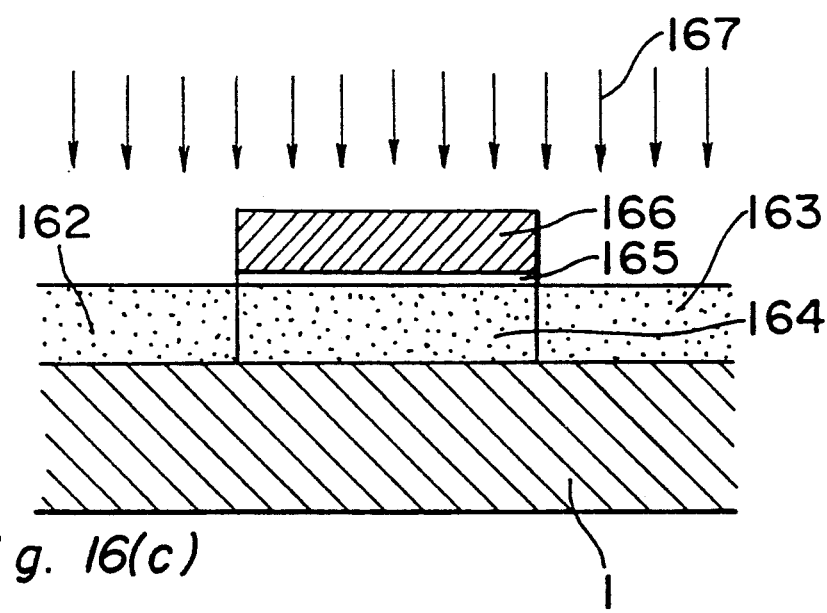

METHOD FOR MANUFACTURING THIN FILM OXIDE SUPERCONDUCTORS AND SUPERCONDUCTOR DEVICES BY X-RAY IRRADIATION

BACKGROUND OF THE INVENTION

1. Field of the Invention

The present invention relates to a superconductor thin film and a manufacturing method therefor, and a thin film superconductor device and a manufacturing method therefor.

2. Prior Art

The P-type oxide superconductive material using electron holes as the electric charge transfer carrier in the normal conductive state of La-Sr-Cu-O base, Y-Ba-Cu-O base, Bi-Sr-Ca-Cu-O base, and Tl-Ba-Sr-Cu-O base materials, etc., has not been clarified in detail as to the superconductivity mechanism thereof, but the transition temperature thereof is higher than the temperature of liquid nitrogen. Therefore, an application to various fields of electronics such as quantum interference elements.

These materials show the change from an insulator (semi-conductor) to a superconductor, depending upon the amount of oxygen atoms contained in the crystal, that is, the state of oxidization. In order to obtain a good superconductor material, the improvement of crystallinity and control of oxidization state are required. According to the manufacturing method for the sintered superconductor material obtained so far, a high temperature process above 800° C. in the oxygen ambient and a slow cooling process below 100° C. are required, which necessitates an installation of a high temperature furnace and a long processing time.

Unlike these P-type superconductor materials, materials of such as Nd-Ce-Cu-O base, Nd-Cu-o-F base, etc. have crystalline structure of $Nd_2CuO_4$ type and N-type oxide superconductor materials including electrons as electric charge carriers in the normal conductivity state.

The N-type superconductor material like the P-type superconductor material shows the change from an insulator (semiconductor) to a superconductor, depending upon the amount of oxygen deficiency contained in the crystal, that is, the state of oxidization. In order to obtain a good superconductor material, improvement of crystallinity and control of oxygen deficiency (state of oxidization) are required. According to the manufacturing method for the superconductor material so far obtained, a careful annealing process at a high temperature above 800° C. under the vacuum (reduction atmosphere) was necessary.

These new superconductor materials can be prepared only by the sintering process primarily at the current technical level and may be available only in the form of a ceramic powder or block. On the other hand, in case of placing these materials into practical use, although processing into thin films is strongly demanded, it is very difficult to prepare a thin film of good superconductive characteristics according to the conventional technique.

In each of P-type and N-type superconductor thin films so far prepared, the current density in the superconductivity critical condition is small and the time-dependent logarithmic decrease of current density is remarkable, and therefore, it has been considered difficult to realize a superconductor device of high stability and reliability.

In the case of using these p-type and N-type cuprocompound superconductors as a superconductive magnetic memory, various methods have been devised to distinguish 1 and 0. In the case of utilizing superconductor thin film for super conductive magentic memory, according to the conventional proposal, the distinction between 1 and 0 memory states are made by detecting fluxoids replenished in the superconductor material or in the space enclosed by superconductors with a detector to examine the presence or non-presence of fluxoids, and by using a cuprocompound superconductor of high transition temperature, it is possible to operate a superconductive magnetic memory at the liquid nitrogen temperature.

Conventionally, there have been proposed various superconductive magnetic memories using niobic nitride (NbN) of an A15 type two-component compound or niobic germanium ($Nb_3Ge$). However, the superconductivity transition temperatures $T_c$ of these materials are 24 K. at the most. Furthermore, as perovskite compounds, there are known materials of Ba-Pb-Bi-O base (Japanese Patent Laid-Open Publication No. SHO60-173885/1985) and there are researched a lot of superconductor elements using materials of this base. However, $T_c$ of this material is relatively as low as 13 K. and it is difficult to place this material into practical use. The high temperature superconductor material has a transition temperature higher than the liquid nitrogen temperature and it is greatly expected to place said material into practical use.

Recently, there is reported a field effect type superconductor transistor using high temperature superconductor thin film (A. Yoshida, H. Tamura, N. Fujimaki, and S. Hasuo, Extended Abstracts of 1989 International Superconductivity Electronics Conference, DE2-2). This superconductor transistor is prepared in the following manner: That is, after forming Ba-Y-Cu-O superconductor thin film on a MgO substrate, by heat-treating at 600° C. in the nitrogen atmosphere, said superconductor thin film is reduced to prepare a thin film of semiconductive characteristics deficient of oxygen, and after a gate insulating film made of $BaF_2$ and a gold gate electrode are formed on said semiconductor thin film, by exposing them to oxygen plasma, oxygen is doped so as to recover superconductive characteristic in the thin film portions corresponding to the source area and drain area, thus to prepare a superconductor transistor.

PROBLEM TO BE SOLVED BY THE INVENTION

Forming superconductor into thin film according to the present invention is accomplished by decomposing superconductor raw material into minute corpuscles of atomic state and then depositing the same on a substrate as a compound thin film. As compared with a sintered body, a film of good crystallinity and of better homogeneity can be obtained. However, the crystallinity of thin film obtained in the formation process of complex compound thin film and the amount of oxygen (deficiency) taken therein are not always sufficient to obtain good superconductive characteristics, and to provide the best superconductive characteristics, an improvement of crystallinity and sufficient intake of oxygen or processing for generating oxygen deficiency are required.

Generally, the flux pinning force of a cuprocompound superconductor thin film is very weak, and a large flux creep is observed at the liquid nitrogen temperature. Because of the existence of this phenomenon, in the case of using the cuprate compound superconductor thin film as a memory medium of the superconductive magnetic memory, the instability such as time-dependent changes in the characteristics thereof constitutes a serious problem for placing the transistor into practical use. In order to improve the critical current density of the cuprate compound superconductor thin film and increase the activation energy for the flux creep, it is necessary to generate appropriate pinning centers for fluxoid quantums in the thin film at a proper density. The present invention aims to solve the above-described conventional problem and to provide a superconductor thin film having a large critical current density and a strong flux pinning force and a superconductive magnetic memory of excellent memory characteristic using the same.

According to the conventional method of heating the high temperature superconductor at a high temperature in the vacuum, the integration of the superconductor thin film with the normal semiconductor circuit is difficult, and the method of irradiating reducing active ions such as hydrogen ions has disadvantages in that the superconductor is damaged by active ions and the superconductor characteristics are not recovered even by an oxidization processing effected thereafter, and therefore, application to the Josephson devices is difficult. The method of irradiating photons having energy larger than ultraviolet rays according to the present invention does not have such a problem and provides a manufacturing method for Josephson devices using new high temperature superconductor thin films.

Furthermore, in the superconductor transistor prepared by using conventional Ba-Y-Cu-O base superconductor thin film and making the source area and the drain area superconductive through control of oxygen density, there is a problem that due to diffusion of oxygen atoms, time-dependent changes in characteristics of the device are large, and the realization of a superconductor transistor of small time-dependence is strongly desired.

SUMMARY OF THE INVENTION

One of objects of the present invention is to provide superconductor thin films having a large critical current density and a small giant flux creep (large time dependence of magnetization).

Another object of the present invention is to provide a manufacturing method for superconductor thin films which is capable of controlling defects such as oxygen defects in the thin films.

A further object of the present invention is to provide superconductor transistors having a small flux creep.

A still further object of the present invention is to provide a manufacturing method for superconductor transistors.

One of the other objects of the present invention is to provide superconductor magnetic memories having a small giant flux creep and a manufacturing method therefor.

One more object of the present invention is to provide a method for manufacturing Josephson devices effectively.

In the superconductor thin film according to the present invention as well, the crystalline structure thereof and the content of oxygen atoms or oxygen deficiencies, that is, the state of oxidization change, depending on the atmosphere and the temperature, and the superconductive characteristics are also changed. Although said superconductive characteristics can be improved to some extent by appropriate improvements in the crystalline structure and oxidizing or reducing processing, the effect is affected by the diffusion behavior of oxygen, or is not effective to portions once exposed to the outside air and subjected to an irreversible oxidizing or reducing reaction.

The inventors of the present invention have found out that excellent superconductor thin films can be realized with a good controllability and stability by carrying out irradiation of photons having energy (more than 2 eV and less than 100 k eV) larger than ultraviolet rays and an oxidization processing as the processing for crystallinity improvement of superconductor thin films and for control of the content of oxygen deficiencies upon formation of said complex compound superconductor thin films or thereafter, and have developed the present invention. The oxygen deficiencies of the high temperature superconductor thin film are of smaller free energy as compared with the surrounding thereof and thereby, form effective pinning centers for the fluxoid quantums in the critical state. According to the aforementioned irradiation of photons having an energy larger than ultraviolet rays, the oxygen deficiencies can be introduced without breaking the ordering of the metal elements. Since the coherence length of the high temperature superconductor is short, it is effective for pinning of fluxoid quantums to uniformly generate oxygen deficiencies in the crystal. In the superconductor thin film of less than several micrometers thickness, depending on the energy of photons used, it becomes possible to generate homogeneous oxygen deficiencies throughout the entire film thickness. Although the critical current density of the thin film superconductor can be improved and the activation energy of the flux creep can be increased even by this only, it has been found that when photons are irradiated onto the thin film surface at an incident angle below the total reflection angle, oxygen deficiencies are formed in the surface first layer only. Such a superconductor thin film subjected to irradiation of photons having energy larger than ultraviolet rays and, if necessary, to an oxidization processing has a magnetization curve completely different from those conventionally known, and since it is small in the time-dependent change and stable, it has an excellent potential for a superconductive magnetic memory medium.

The manufacturing method for a Josephson device according to the present invention is characterized by:

a step of carrying out an oxidization processing selectively only on the two areas separated by a minute gap portion, after irradiating photons having an energy larger than ultraviolet rays onto the surface of the superconductor thin film; or a step of carrying out an oxidization processing on the surface of metallic oxide superconductor thin film simultaneously on or after irradiating photons having an energy larger than ultraviolet rays selectively only onto the two portions separated by a minute gap portion on the surface of metallic oxide superconductor thin film; or a step of performing an oxidization processing only on the two areas separated by a minute gap portion on the superconductor thin film surface simultaneously on or after irradiating photons having an energy larger than ultraviolet rays selectively only onto said two areas; in order to form a junction portion on said gap portion of said superconductor thin film.

Furthermore, as a mask pattern for forming the junction portion, an electron beam resist or a negative resist for opto-lithography of an acrylic resin such as PMMA or of a styrene resin such as CMS can be used. Furthermore, it is possible to irradiate oxygen ions or quasistable oxygen atoms in the excited state, or to perform an oxidization process in an atmosphere containing ozone.

In the superconductor transistor according to the present invention wherein a gate electrode is formed on the surface of the channel layer through a gate insulating film, a superconductive source area, said channel layer and a superconductive drain area are made of high temperature superconductor thin films, and can be realized by using, for said superconductive source and drain areas, materials of improved crystallinity over said channel layer by the irradiation of photons having an energy larger than ultraviolet rays. Furthermore, the manufacturing method for the superconductor transistor comprises the following steps:

a step of forming by patterning respective portions corresponding to the superconductive source area, the channel layer and the superconductive drain area, after forming the superconductor thin film;

a step of forming a gate insulating film and a gate electrode on said thin film portion corresponding to said channel layer; and a step of forming the superconductive source, superconductive drain and channel layer by performing an oxidization processing simultaneously on or after irradiating photons having energy larger than ultraviolet rays onto said thin film from the side of said gate electrode.

Particularly for the gate electrode material, the use of metal or silicide is preferably used to shield photons of a wavelength less than those of ultraviolet rays.

The thin film superconductor according to the present invention is homogeneous as compared with conventional sintered bodies, and the improvement of crystallinity and the content amount control of oxygen atoms or oxygen deficiencies are possible by the irradiation of photons having an energy larger than ultraviolet rays and heat treatment in an oxygen atmosphere, or the irradiation of oxygen ions or oxygen atoms in the excited state. In the present invention, as a method for enhancing the crystallinity of P-type superconductors, x-ray irradiation or ultraviolet ray irradiation is performed simultaneously on the thin film deposition or suspending said deposition, as a method for the oxidization processing, the heat treatment in the oxygen atmosphere and irradiation of oxygen ions or oxygen atoms of excited state is performed concurrently on the thin film deposition or suspending said deposition. In other words, the present invention is characterized in that by alternately repeating the thin film deposition process, the crystallinity improvement processing and the oxidization processing, the superconductor material of a high performance is realized with excellent controllability and stability.

In the n-type superconductor, the crystallinity improvement and the control of oxygen content are also possible by the irradiation of photons having energies larger than ultraviolet rays.

In either of the P-type and N-type superconductor thin films, the irradiation of photons having energies larger than ultraviolet rays reduces oxides by neutralizing negative ions such as O or F in the crystal through the electron excitation and causing them to release from the crystal. Furthermore, since their potential energies are released in the crystal lattice at the same time, a spike-type lattice vibration due to relaxation of the excited state of inner kernels is excited. This promotes rearrangement of the atomic arrangement of positive ions resulting in the enhancement of the orientation of the crystal.

When photons are irradiated on the thin film surface at an incident angle below the total reflection angle, the oxygen deficiencies are generated in the first layer of the thin film surface without breaking the ordering of metal elements. The oxygen deficiencies in the superconductor become effective pinning centers for fluxoid quantums, and are able to improve the critical current density and at the same time to increase the activation energy of flux creep. By alternately repeating the thin film deposition process, and the process of irradiating photons having energies larger than ultraviolet rays at an incident angle below the total reflection angle, it becomes possible to control the distribution of the surface oxygen deficiencies in the atomic scale. The fluxoid quantum lines do not pierce the film thickness in straight lines but meander in the film thickness. In order to effectively pin fluxoid quantum lines, it is preferable to distribute oxygen deficiencies at a distance from several to several hundreds angstroms in the film thickness direction. Since the flux pinning force thereof is homogeneously strengthened in said superconductor thin film, it is possible to realize a superconductive magnetic memory of high performance thereby.

Because the absolute value of magnetization differs greatly between a strong superconductor and a weak superconductor, it is possible to distinguish memory states by setting an appropriate threshold. In a strong superconductor thin film, since the flux pinning force is homogeneously distributed, when the applied magnetic field is increased, the transition from a greatly demagnetized state to a slightly magnetized state takes place abruptly at a certain magnetic field. This transition is irreversible, and once transferred to a slightly magnetized state, it does not return to the greatly magnetized state. It is also possible to constitute a superconductive magnetic memory by utilizing this irreversible transition and to distinguish 1 and 0 of the memory states.

Since the manufacturing method for the Josephson device according to the present invention requires only the irradiation of photons having energies larger than ultraviolet rays and the oxidization processing, as compared with the conventional method of preparing a minute bridge structure by etching, a Josephson device can be manufactured in a very simple process. Furthermore, since any etching which may cause deformation is not used in this method, this method is effective for integrating various devices. In the manufacturing method according to the present invention, as a result that cuprooxide in the superconductor is reduced by the irradiation of photons having energies larger than ultraviolet rays onto the superconductor thin film surface, the superconductor characteristic thereof is deteriorated at first. Thereafter, only the two areas separated by a minute gap portion are selectively subjected to oxidization processing so as to restore the superconductivity reversibly, and at said gap portion, a Josephson junction is formed as a weak coupling. According to this method, since the oxidization processing is applied only to limited areas, circuits damaged by oxidization can be formed on the same substrate. Since photons are irradiated all over the surface, even a light source not collimated can be used. Furthermore, by irradiating photons having energies larger than ultraviolet rays only onto the two areas separated by a minute gap portion and thereafter performing oxidization processing only, the superconductive characteristic of the irradiated areas are improved, and said gap portion becomes a weak-coupled type Josephson junction. According to this method, the conventional opto-lithography method may be used as it is to selectively irradiate photons on the superconductor thin film surface and the oxidization processing need not be performed partially, many of the techniques conventionally used for manufacturing semiconductor integrated circuits can be used as they are, and therefore the manufacture is easy. Furthermore, according to the manufacturing method of the present invention, photons having energies larger than ultraviolet rays are irradiated only onto the two areas separated by a minute gap portion on the superconductor thin film surface and thereafter only said two areas are subjected to the oxidization processing for improvement of superconductive characteristic, and on said gap portion, a weak-coupled Josephson junction is formed. According to this method, since the photon irradiation and oxidization processing are performed on the limited areas of the metal oxide superconductor thin film surface, the portions requiring no formation of Josephson junctions are not affected by said irradiation and oxidization processing, and therefore, it is effective for integration of Josephson devices and other functional devices.

In a preferred embodiment of the present invention, the superconductive source area and the superconductive drain area are of high temperature superconductor thin film of the same elements and the same composition and by using material improved in the crystallinity by irradiation of photons for said superconductive source and drain areas only, excellent junctions can be obtained between the source and the channel, and between the drain and the channel, and the time-dependent change in the characteristics of the device is reduced, and a field effect type superconductor transistor being stable and of high performance can be realized.

In a preferred embodiment of the manufacturing method for the superconductor transistor according to the present invention, by irradiating photons having energies larger than ultraviolet rays onto the superconductor thin film from the gate electrode side, and by performing oxidization processing simultaneously thereon or thereafter, only the source and drain areas are improved in crystallinity so as to form areas of superconductive characteristics better than the channel layer. At this time, since the gate electrode becomes the mask for photons and the alignment of channel layer and the gate electrode is effected self-aligningly, it becomes easy to manufacture even a superconductor transistor of extremely short wavelength of about 0.1 μm. Particularly, as the material for the gate electrode, it is greatly effective to use metals of good light shielding property or silicide.

BRIEF DESCRIPTION OF DRAWINGS

These and other objects and features of the present invention will become clear from the following description taken in conjunction with the preferred embodiment thereof with reference to the accompanying drawings, in which:

FIGS. 3(a), 3(b) and 3(c) are X-ray diffraction figures showing the crystallinity of a P-type thin film superconductor based on the crystallinity improvement processing and the oxidization processing according to the present invention;

FIG. 16 shows schematical sectional views showing a manufacturing method of superconductive transistors according to the present invention.

DETAILED DESCRIPTION OF THE PREFERRED EMBODIMENTS

Preferred Embodiment 1

A preferred embodiment of the present invention will be described with reference to the accompanying drawings.

Figure 1:
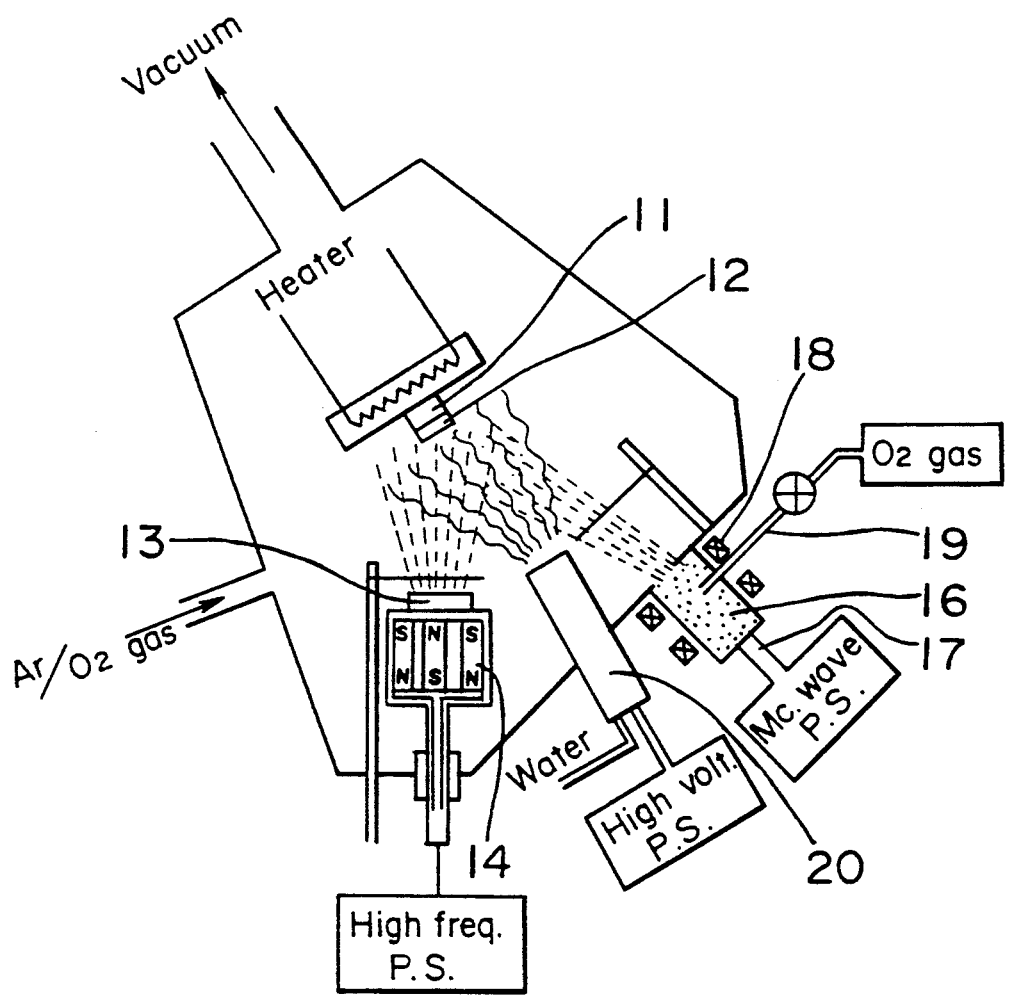
FIG. 1 is a schematic sectional view showing an apparatus for manufacturing N-type thin film superconductors according to a preferred embodiment of the present invention.

As for the device constitution, as shown, for example, in FIG. 1, a formation tank wherein a vapor deposition source for thin film deposition, device for crystallinity improvement and reduction processing, and, for P-type superconductor, a device for oxidization processing are provided is required. In the example shown in FIG. 1, there are used a high frequency magnetron sputtering device as a vapor deposition source, a X-ray source as a device for crystallinity improvement, and a ECR oxygen plasma generating device for oxidization processing of P-type superconductors. Depending upon the type of combination for the vapor deposition source, the crystallinity improvement device and the oxidization processing device, it is necessary to separate the formation tank and provide a load lock mechanism so as to move the substrate together with the holder thereof.

As shown in FIG. 1, a four-element compound thin film 12 is formed, for example, by the sputtering method. In this case, as the substrate, a single crystal substrate is effective for forming a 4-element compound thin film of good crystallinity, and single crystals of magnesium oxide, $LaAlO_3$, $LaGaO_3$, strontium titanic acid, etc. are used.

The inventor of the present invention et al. have confirmed that in case of attaching thin film 12 onto the rear face of substrate 11, in order to provide superconductive characteristic, the temperature range of 500° to 900° C., and that of 400° to 1100° C. are suitable respectively for P-type and N-type. The optimum substrate temperature for optimizing the crystallinity, composition and surface condition of compound thin film falls in this temperature range.

P-type superconductors A-B-Cu-O of Bi or Y base have not yet definitely determined about the crystal structure and composition formula, but is is considered that the smaller the oxygen deficiency amount, the higher the superconductivity transition temperature. In sintered bodies, the stabilization of crystal and oxygen supply (oxidization processing) are performed by a high temperature treatment of above 800° C. in oxygen atmosphere followed by a slow cooling process below 100° C./hr.

The inventors of the present invention have confirmed that thin films of high crystallinity are excellent in the initial characteristics and stability on the long time basis, and control of the crystallinity during film formation or immediately thereafter and the content amount of oxygen atoms or oxygen deficiency provides better superconductive characteristics. From the standpoint of the manufacturing process, when films are once taken out of the thin film formation tank, moisture in the air is adsorbed on the surface and reacts with the constituent elements of the thin film, resulting in deterioration of the characteristics. Therefore, it is necessary to incorporate the crystallinity improvement and reduction processing, and the oxidization processing for P-type superconductor into the thin film formation process as a part thereof.

The inventors of the present invention tried the following three types of methods as the methods for the crystallinity improvement and reduction processing, and the processing for oxidizing P-type superconductor: 1) method of performing as the after-treatment immediately after thin film deposition, 2) method of performing simultaneously with thin film deposition, and 3) method of performing by interrupting thin film deposition, that is, method of alternately repeating thin film deposition process, crystallinity improvement and reduction processing process, and oxidization processing process for a P-type superconductor, and confirmed that each method is able to obtain superconductor thin film of better characteristics as compared with the case where no processing for crystallinity improvement or for oxidization is performed.

First, the inventors of the present invention found out that when during formation of p-type superconductor thin film, X-ray irradiation is made, immediately after thin film formation, oxygen gas is introduced into the formation tank, and an oxidization processing as the after-treatment is performed by the slow cooling process the same as for sintered bodies, an excellent superconductive characteristics is obtained. The inventors further discovered that it is within a limited temperature range below the substrate temperature for thin film formation and above the normal temperature that the crystallinity of thin film is improved by X-ray irradiation and oxygen is taken into thin film most effectively, and that the processing for crystallinity improvement and reduction, and the oxidization processing for p-type superconductor can be performed most efficiently and easily by performing the same within this temperature range for a given time. The inventors of the present invention further discovered that this effect is also observed when the processing for crystallinity improvement and reduction, and oxidization processing for P-type superconductor are performed by interrupting the thin film deposition, that is, the thin film deposition process, the crystallinity improvement and reduction process and the oxidization process for a p-type superconductor are alternately repeated. Since the temperature for performing such crystallinity improvement and reduction processing, and P-type superconductor oxidization processing differs depending upon the kind of constituent elements of thin-film and the surface condition thereof, it is necessary to select a proper temperature for each case. The inventors of the present invention confirmed that it is within a temperature range below 450° C. and above 300° C. With respect to the processing time, a necessary minimum value exists depending on the kind of thin film, film thickness and the surface condition.

The inventors of the present invention discovered that as a method for the oxidization processing used in the case of performing the crystallinity improvement and reduction processing and the oxidization processing for p-type superconductor simultaneously with the thin film deposition or performing the same by interrupting the thin film deposition, that is, alternately repeating the thin film deposition process, the crystallinity improvement and reduction processing process and the oxidization processing process for P-type superconductor, t is effective and simple to process by oxygen ions generated by the discharge of a gas containing at least oxygen or to irradiate neutral oxygen atoms in the excited state.

It was discovered by the inventors that high energy oxygen ions and neutral oxygen atoms effectively oxidize P-type superconductor thin film by using, for example, the ECR oxygen plasma generating device shown in FIG. 1, introducing oxygen gas or a mixture gas containing oxygen into the plasma generation chamber 16 connected to said formation tank, generating discharge plasma by irradiating microwaves onto this gas, applying a magnetic field thereto with a magnet 18 so as to raise ionizing efficiency.

In the case where such efficient oxidization processing for P-type superconductor is used as the after-treatment process after the crystallinity improvement and reduction processing, although the critical temperature reaches the maximum value in a short time, the critical current density continues to increase, depending on the processing time and it takes a processing time of ten and several hours to reach the maximum value. This is considered to mean that the oxidization processing is affected by the diffusion behavior of oxygen and it takes a very long time for the processing to cover the entire superconductor thin film. Therefore, in order to obtain quality superconductor thin film subjected to sufficient oxidization processing, it is considered preferable to perform the oxidization processing simultaneously with the thin film deposition processing, the crystallinity improvement and reduction processing or by interrupting the thin film deposition processing and the crystallinity improvement and reduction processing, that is, while alternately repeating the thin film deposition process, the crystallinity improvement and reduction processing process and the oxidization processing process.

From the mere standpoint of performing the crystallinity improvement and reduction processing and the oxidization processing, it is the most desirable to perform the crystallinity improvement and reduction processing and the oxidization processing simultaneously with the thin film deposition, but since the processing temperature is limited to the deposition substrate temperature, depending on the kind of thin film deposition process, a sufficient effect can not be otained, or on the contrary, high energy oxygen may affect it adversely. The inventors of the present invention confirmed that in the case of performing the crystallinity improvement and reduction processing and the oxidization processing by interrupting the thin film deposition, that is, alternately repeating the crystallinity improvement and reduction processing process, the oxidization processing process and the thin film deposition process, an effect equal to or more than that can be obtained. In these thin film deposition processes, each constituent element immediately after deposition is in the excited state, and in many cases, it may take a time of serveral minutes to become stabilized, and particularly with respect to thin film of laminated structure, the deposition process may be interrupted each time a thin film of one period structure is deposited in order to achieve stability. If the crystallinity improvement and reduction processing and the oxidization processing are performed during the deposition interruption as described above, an ideal crystallinity improvement and reduction processing and the oxidization processing are considered to be performed in a short time. The inventors of the present invention confirmed that by interruption for each proper deposition time and performing the crystallinity improvement and reduction processing and the oxidization processing, a p-type superconductor thin film of an excellent characteristics may be obtained. They further confirmed that as said deposition time interval, it is effective to set it so that the film thickness deposited during the time is more than 10 Å and less than 100 Å.

Concrete Embodiment 1

Figure 2:
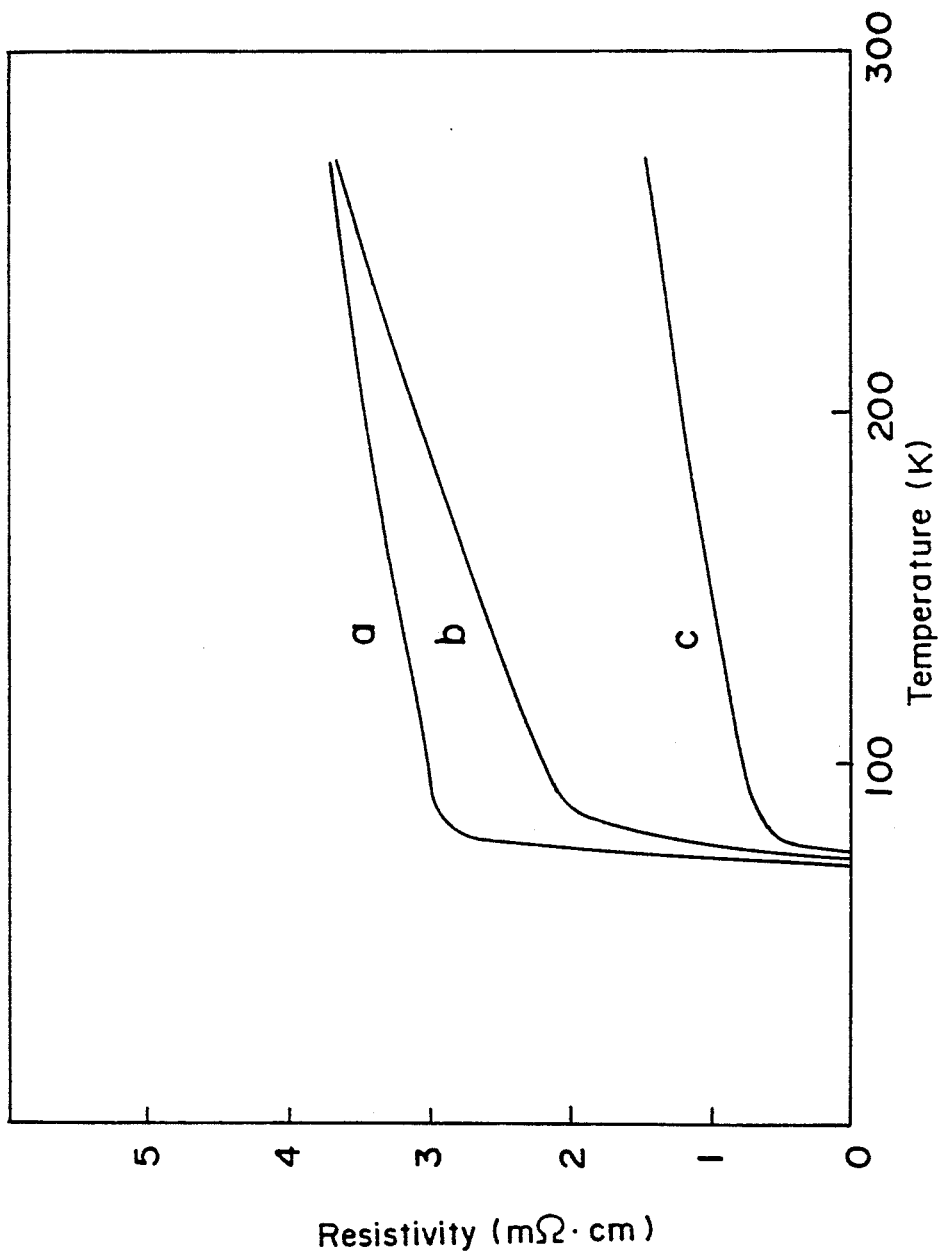
FIG. 2 is a drawing showing the temperature dependency of resistivity showing the superconductive characteristic of a P-type thin film superconductor based on the crystallinity improvement processing and the oxidization processing according to the present invention.
Figure 3A:
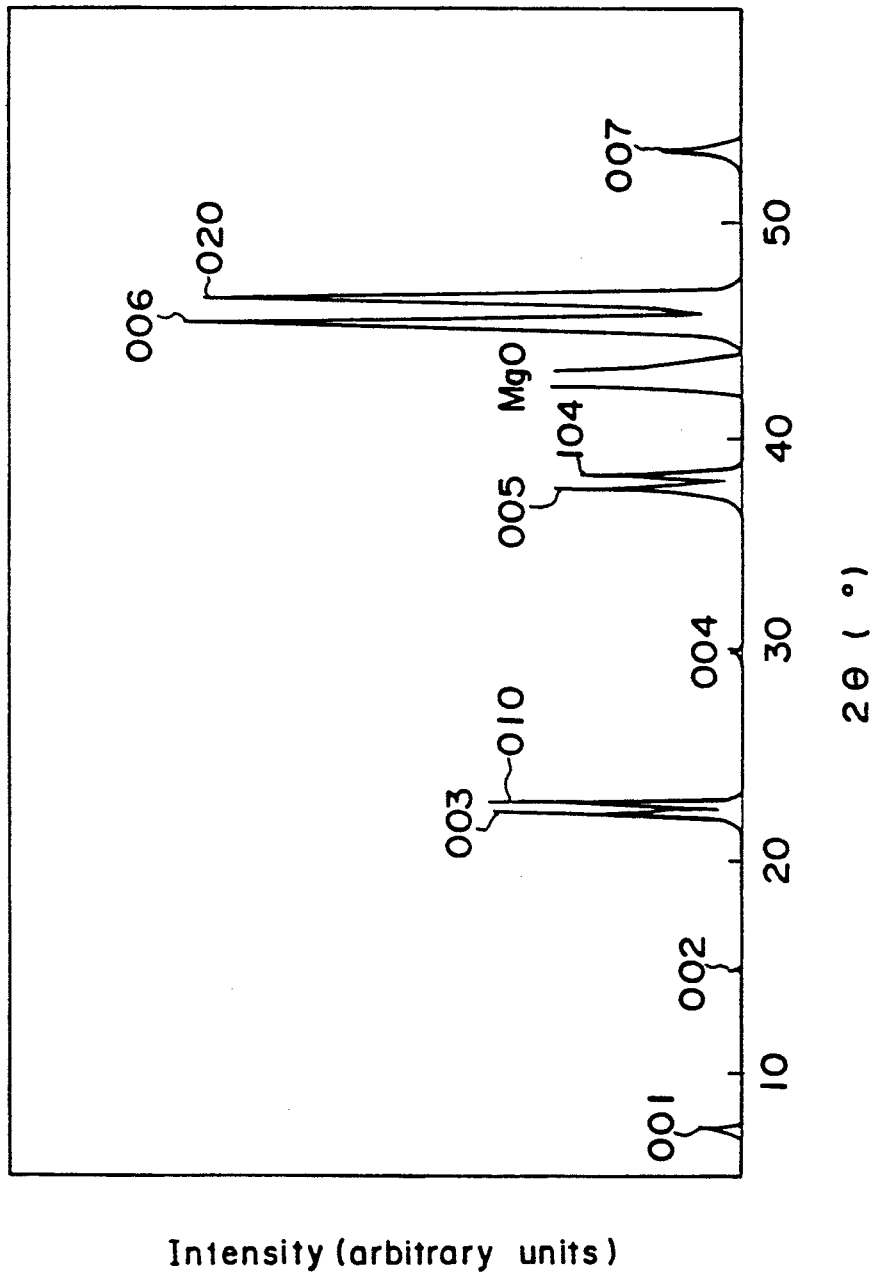
Figure 4:
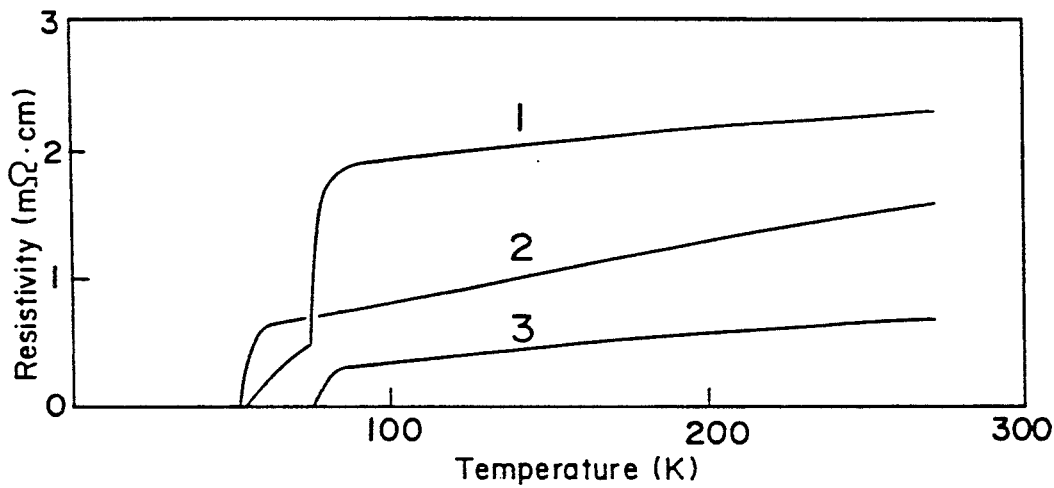
FIG. 4 is a graph showing the temperature dependency of resistivity showing the superconductive characteristic of a P-type thin film superconductor based on the combination of various crystallinity improvement processings and oxidization processings.
Figure 5:
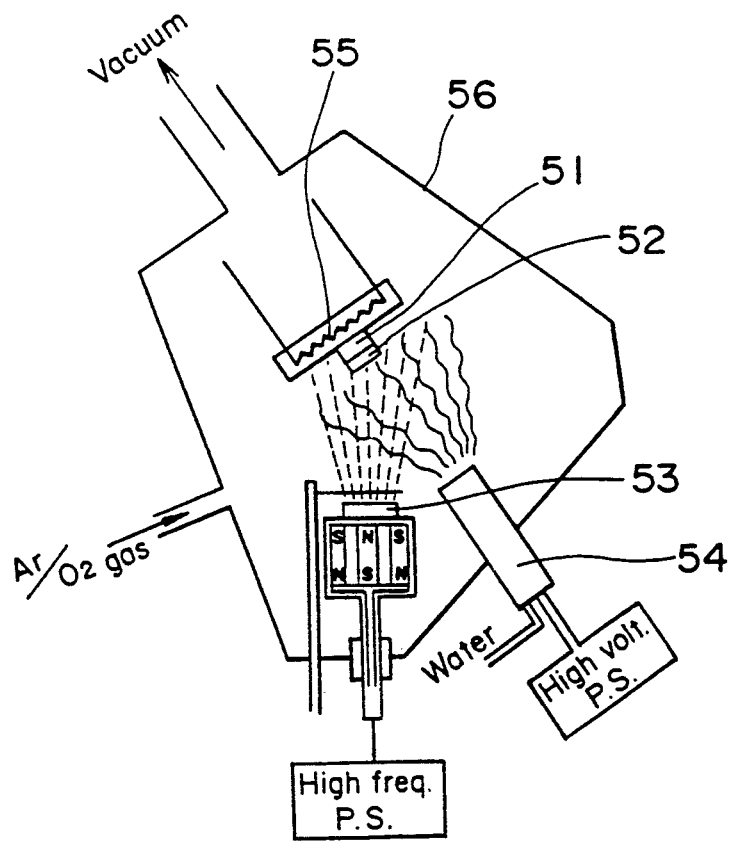
FIG. 5 is a schematic sectional view showing the basic constitution of the manufacturing device of N-type thin film superconductor according to a preferred embodiment of the present invention.

By using magnesium oxide single crystal (100) surface as a substrate 11, by sputter-depositing target 13 formed of a sintered oxide high temperature superconductor material by high frequency planar magnetron sputtering method in the atmosphere of Ar and $O_2$ mixture gas, a crystal Y-Ba-Cu-O thin film was deposited on said substrate. In this case, the deposition conditions were: a gas pressure of 0.4 Pa, sputtering electric power of 160 W, sputtering time of 1 hour, thin film thickness of 0.5 μm and a substrate temperature of 600° C. The respective temperature dependency of resistivity in the case where immediately after the crystallinity improvement processing by X-ray irradiation using Rh bulb and the film formation, oxygen gas is introduced into the formation tank and no oxidation processing as the after-treatment by the same slow cooling process as used for sintered bodies is performed, in the case where no crystallinity improvement processing by X-ray irradiation using Rh bulb is performed, and in the case where immediately after the crystallinity improvement processing by X-ray irradiation using Rh bulb and thin film formation, oxygen gas is introduced into the formation tank, and the oxidization processing and the after-treatment by the same slow cooling process as used for sintered bodies is performed are shown in FIGS. 2a, 2b and 2c. Furthermore, X-ray diffraction figures showing crystallinity for the respective cases are shown in FIGS. 3a, 3b and 3c. From FIG. 2, it is known that as compared with the case where only the oxidization processing is performed, in the case of using the crystallinity improvement processing, further improvement of the superconductive characteristic is obtained. From FIG. 3, it is known that by the crystallinity improvement processing, the orientation of thin film c face is improved so that the crystallinity is improved and by the oxidization processing, the face distance is reduced.

The inventors of the present invention tried, as the method for performing the crystallinity improvement processing and the oxidization processing, the following three kinds of methods: (1) a method of performing the same as the after-treatment of thin film deposition, (2) method of performing the same simultaneously with thin film deposition, (3) method of performing the same by interrupting thin film deposition, that is, method of alternately and periodically repeating the thin film deposition process, the crystallinity improvement processing process and the oxidization processing process. In this case, as the oxidization processing method, ECR oxygen plasma oxidization method shown in FIG. 1 was used, and the processing conditions were microwave power of 200 W oxygen gas pressure of $8.5 \times 10^4$ Torr, bias voltage of 50 V. In the case (3) of alternately and periodically repeating the thin film deposition process, the crystallinity improvement processing process and the oxidization processing process, the film thickness deposited in one period, the crystallinity improvement processing time, and the oxidization processing time were respectively set at about 100 Å, 10 minutes and 72 seconds. In each case of oxidization methods (1) and (2), the crystallinity improvement processing time by Hall ultraviolet ray irradiation was set at 2 hours, the oxidization processing temperature was set at 450° C., and the processing time was set at 1 hour. The inventor of the present invention et al. confirmed that by using any combination of the thin-film deposition process, the crystallinity improvement processing process and the oxidization processing process of cases (1), (2) and (3), a higher transition temperature and a larger critical current density may be obtained as compared with the case where no crystallinity improvement processing and oxidization processing are performed. The details of the variation of the superconductive characteristics due to the difference to the constituent elements of compound oxide thin film of this kind are not clear. The details of the variation of the optimum conditions for the crystallinity improvement processing and oxidization processing are also not clear. However, it is clear that the crystallinity improvement processing and the oxidization processing have a great effect on the superconductor characteristic and the present invention establishes the crystallinity improvement processing process and the oxidization processing process for formation of a P-type superconductor thin film.

Preferred Embodiment 2

It was discovered that an excellent superconductor characteristic can be obtained by performing X-ray irradiation during formation of N-type superconductor thin film and holding thin film in the vacuum at a temperature within the range of 200° C. to 800° C. Furthermore, it was discovered that the temperature range wherein the crystallinity improvement and reduction by X-ray irradiation is performed the most effectively is a limited temperature range below the substrate temperature for thin film formation and above the normal temperature, and that the crystallinity improvement and reduction processing can be performed the most efficiently and easily by performing the same for a given time within this temperature range. The inventors of the present invention confirmed that this effect is also seen in the case of performing the crystallinity improvement and reduction processing by interrupting thin film deposition, that is, alternately repeating thin film deposition process, and the crystallinity improvement and reduction processing process. Since the temperature for the crystallinity improvement and reduction processing differs depending on the composition of thin film, and the surface condition thereof, selection of an optimum temperature for each case is necessary, and the inventors confirmed that the optimum temperature is within a temperature range of 600° C. to 900° C. Furthermore, with respect to the processing time, a necessary minimum value exists depending on the thin film composition, film thickness and the surface condition.

From the mere standpoint of performing a crystallinity improvement and reduction processing, it is the most desirably to conduct this processing concurrently with the thin film deposition, but it was confirmed that since the processing temperature is limited to the thin film deposition temperature, depending on the kind of thin film deposition process, a sufficient effect may not be obtained in some cases, the inventors of the present invention confirmed that rather in the case of conducting the crystallinity improvement and reduction processing by interrupting thin film deposition, that is, in the case of alternately repeating the thin film deposition process, and the crystallinity improvement and reduction processing process, an equal or larger effect can be obtained.

Concrete Embodiment 2

Figure 6:
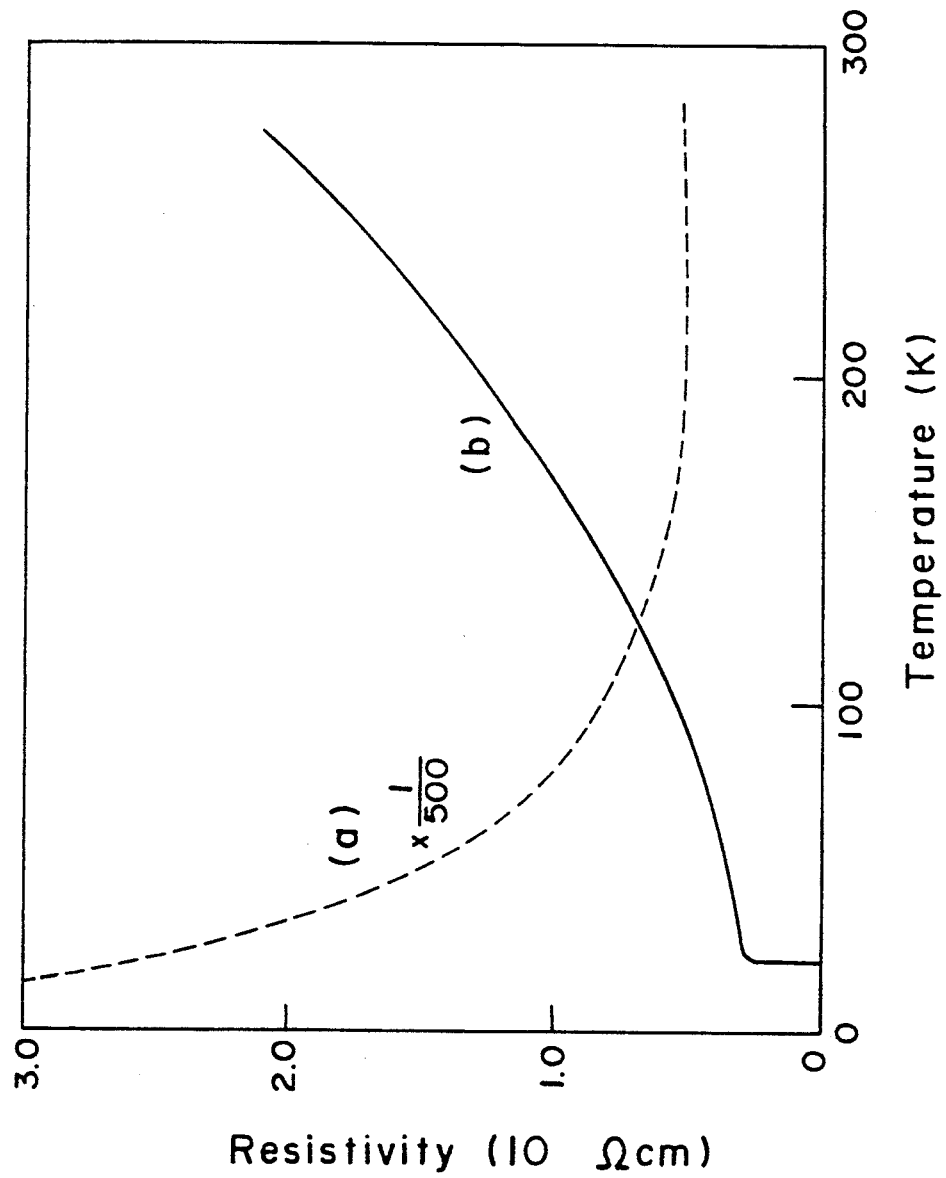
FIG. 6 is a graph showing the temperature dependency of resistivity showing the superconductive characteristic of an N-type thin film superconductor based on the crystallinity improvement processing and the reduction processing according to the present invention.
Figure 7:
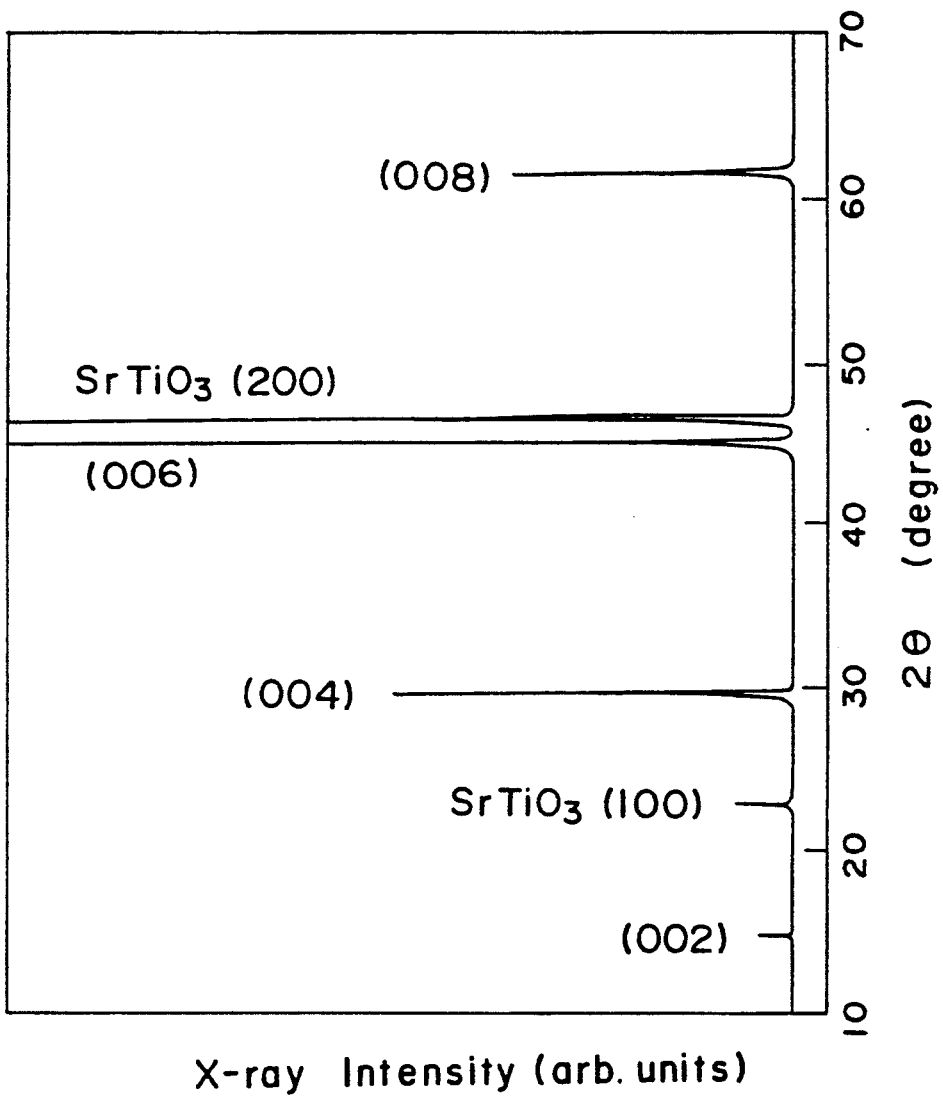
FIG. 7 is a X-ray diffraction figure showing the crystallinity of an N-type thin film superconductor based on the crystallinity improvement processing and the oxidization processing according to the present invention.

By using a strontium titanic acid single crystal (100) face as substrate 51 and by sputtering vapor-depositing target 53 formed of sintered oxide high temperature superconductor material by high frequency planar magnetron sputtering method in the atmosphere of Ar and $O_2$ mixture gas, a crystal Nd-Ce-Cu-O thin film was deposited on said substrate. In this case, the processing conditions were: gas pressure of 0.3 Pa, sputtering electric power of 160 W, sputtering time of 1 hour, thin film thickness of 0.8 $\mu$m, and a substrate temperature of 650° C. By conducting the crystallinity improvement and reduction processing by X-ray irradiation using Rh bulb and by holding the thin film at 1100° C. and in the vacuum of $8 \times 10^{-7}$ Torr, and excellent superconductive characteristic was obtained. Respective temperature dependencies of resistivity in the case where no crystallinity improvement processing by X-ray irradiation using Rh bulb is effected and in the case where the crystallinity improvement and reduction processing by X-ray irradiation using Rh bulb is effected are shown in FIGS. 6a and 6b. Furthermore, an X-ray diffraction figure showing the crystallinity of FIG. 6b is shown in FIG. 7. From FIG. 6, it is understood that in the case where the crystallinity improvement and reduction processing is conducted, superconductive characteristics are obtained. Further from FIG. 7, it is understood that by the crystallinity improvement and reduction processing, a thin film of high orientation is obtained.

The inventors of the present invention tried, as methods for conducting the crystallinity improvement and reduction processing, the following three kinds of methods: (1) conducting said processing as the after-treatment of thin film deposition, (2) conducting said processing concurrently with thin film deposition, and (3) conducting said processing by interrupting thin film deposition, that is, alternately and periodically repeating the thin film deposition process, and the crystallinity improvement and reduction processing process. In the case (3) of alternately and periodically repeating the thin film deposition process, and the crystallinity improvement and reduction processing process, the film thickness deposited during one period and the processing time for crystallinity improvement and reduction were set at about 100 Å and 10 minutes, respectively. The inventors of the present invention confirmed that by using any combination of the thin film deposition process, and the crystallinity improvement and reduction processing process classified in cases (1), (2) and (3), a high transition temperature and a high critical current density can be obtained.

The details of the variation of the superconductor characteristics due to the difference in the composition of these kinds of compound oxide superconductor thin film is not clear, nor are the details of the variation of the optimum condition for the crystallinity improvement and reduction processing clear. However, there is no doubt that the crystallinity improvement and reduction processing has a great influence on the superconductor characteristics and the present invention establishes the crystallinity improvement and reduction processing process for new N-type superconductor thin films of $Nd_2CuO_4$ crystal structure.

Preferred Embodiment 3

Figure 8:
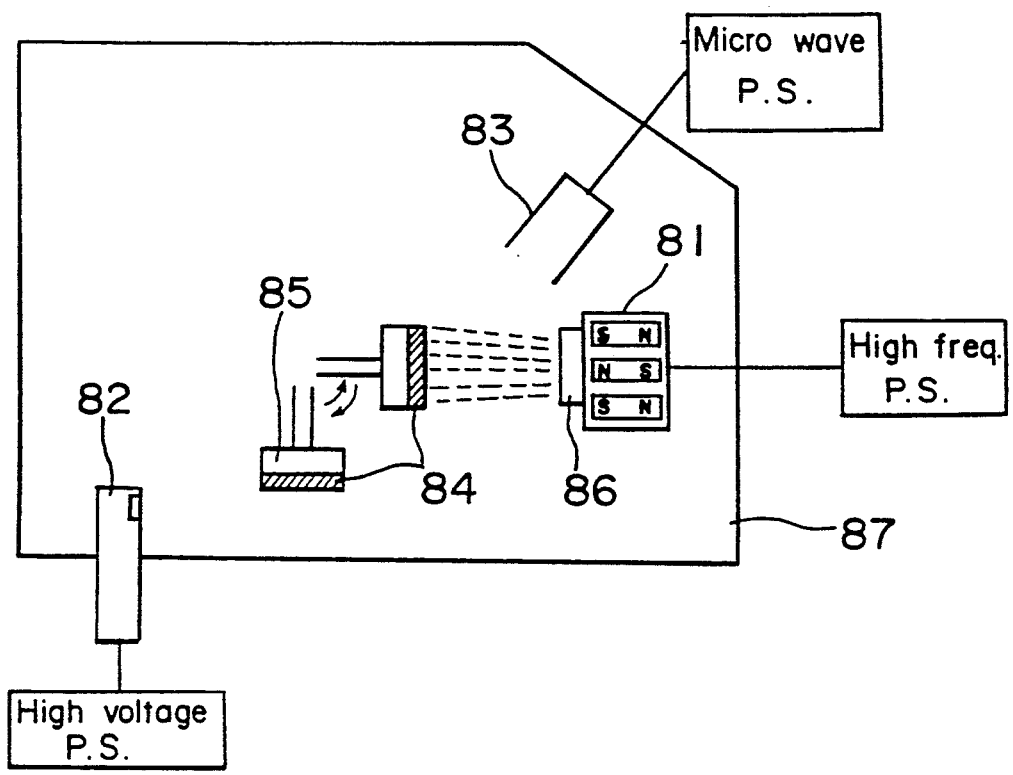
FIG. 8 is a schematic sectional view showing the basic constitution of the thin film superconductor characterized by the photon irradiation at an incident angle below the total reflection angle according to the present invention.

FIG. 8 is a basic constitution sectional drawing for a thin film superconductor according to an preferred embodiment of the present invention which is characterized by irradiating photons at an incident angle below the total reflection angle. In the same formation tank, there are provided a vapor deposition source 81 (here, as an example, high frequency magnetron sputtering device) for thin film deposition, a device 82 (here, as an example, Rh X-ray bulb) for irradiating photons having energy larger than ultraviolet rays onto deposited thin film surface at an incident angle below the total reflection angle for making a surface oxygen deficiency and an oxidization processing device 83 (here, as an example, an ECR oxygen plasma generating device). Superconductor thin film 84 is formed on a single crystal substrate 85. It was confirmed that though the thin film deposition process and the photon irradiation process are alternately repeated, when the photon irradiation interval is so set that the thin film thickness deposited during said interval is more than 10 Å and less than 100 Å, it is effective for pinning fluxoid quantum lines. This relects that the coherence length of high temperature superconductor is short and shows the oxygen deficiency is smaller in the free energy as compared with the surrounding and becomes an effective pinning center for the fluxoid quantum lines in the critical state.

Figure 9:
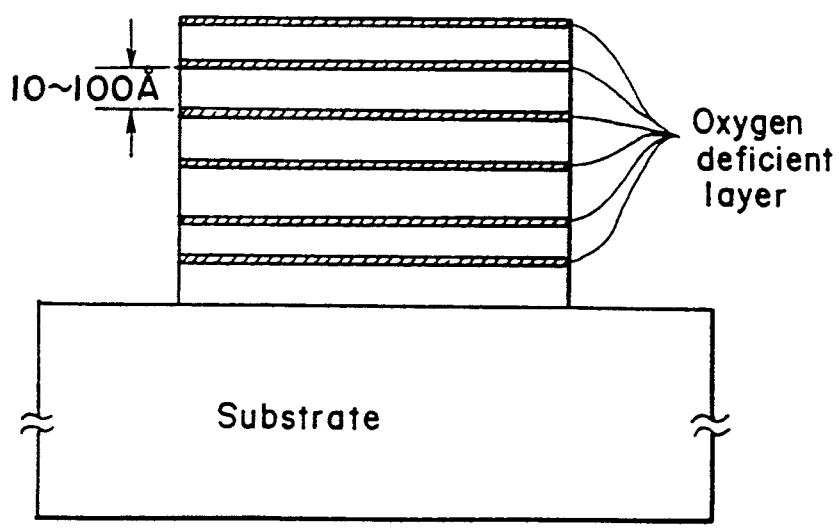
FIG. 9 is a sectional view of the superconductor thin film including oxygen deficiencies periodically in the film thickness direction.

In other words, when oxygen deficiencies are distributed, as shown in FIG. 9, in the film thickness direction at an interval of several angstroms to a hundred angstroms, it is considered possible to pin fluxoid quantum lines over the entire film thickness.

Preferred Embodiment 4

Figure 10:
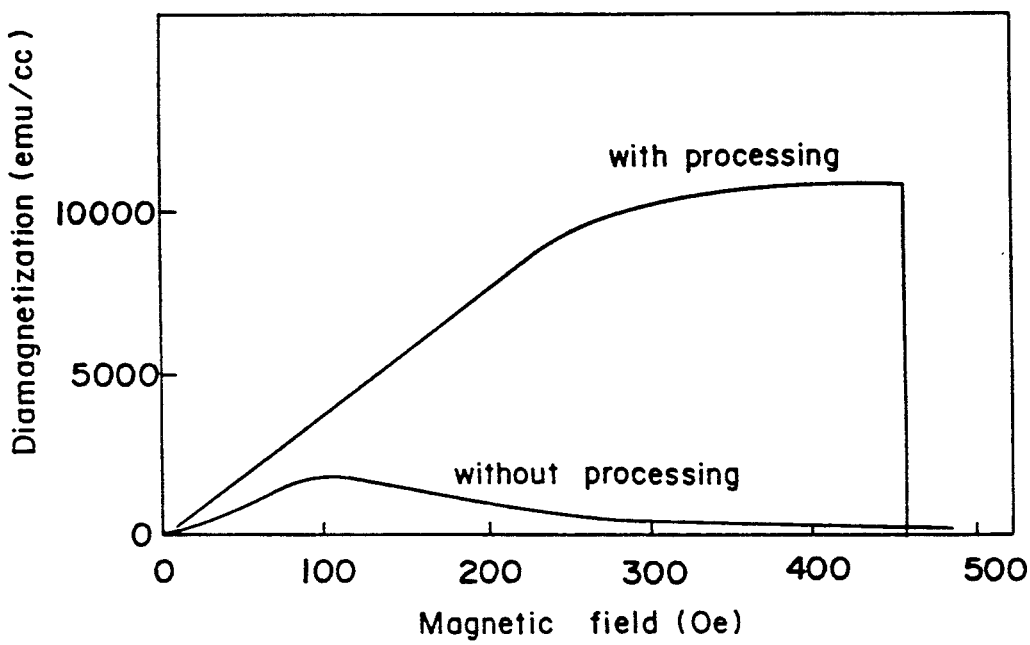
FIG. 10(a) is a graph showing the magnetic field change of the diamagnetization of the thin film superconductor in the cases where the processing according to the present invention was conducted and where said processing was not conducted.
FIG. 10(b) is a pattern example of the superconductive magnetic memory.
Figure 10:
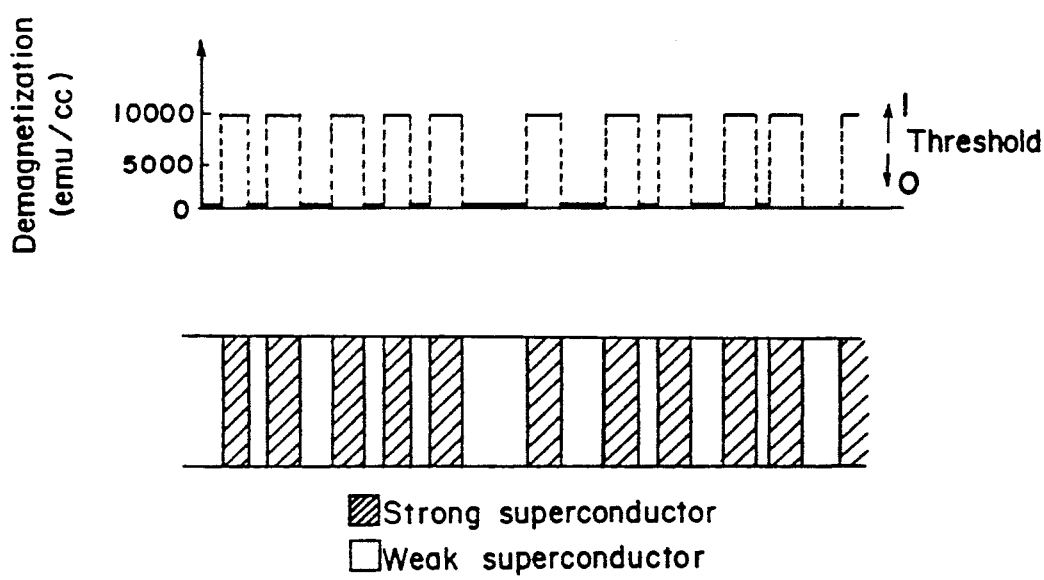

The magnetization curves measured at a constant temperature for a superconductor thin film sample subjected to a crystallization reduction processing and that not subjected to said processing are shown in FIG. 10a. A SQUID magnetic fluxmeter was used and an external magnetic field was applied in parallel to the c axis (that is, in the direction perpendicular to the film surface). The change in the magnetization by the magnetic field of the sample not subjected to the processing is the usually observed change of a superconductor of the second order. In the sample subjected to the crystallization reduction processing, as the external magnetic field is increased, the diamagnetism increases approximately linearly and at a certain magnetic field, it abruptly drops to several tenths. The diamagnetism once decreased can not be recovered even when the external magnetic field is returned to zero. The diamagnetism value under the constant external magnetic field almost stays unreduced for the time-dependent change. These results are considered to be ascribed to the fact that the intensity distribution of the flux pinning force in the superconductor thin film is homogeneous. That is, when an external magnetic field is applied to "a superconductor thin film subjected to crystallization reduction processing" cooled under zero magnetic field, it behaves as a perfectly diamagnetic body up to a certain external magnetic field and shows a large diamagnetism. However, once the intrusion pressure into the interior of the superconductor by the external magnetic field exceeds a certain flux pinning force, the magnetic flux intrudes into the inside and the diamagnetism value decreases at once. When the "superconductor thin film subjected crystallization reduction processing" is once intruded on by flux, the diamageticism value will not be recovered even when the external magnetic field is returned to zero. Such a singular magnetic behavior was fist discovered by the inventors of the present invention.

Regarding p-type superconductors, since a strong superconductor is prepared by irradiation of photons having energy larger than ultraviolet rays accompanied by an oxidization processing, and a weak superconductor is prepared by an oxidization processing only, when an oxidization processing is conducted over the entire surface after photon irradiation patterned by using photo-lithography technique, a bit patter as shown, for example, in FIG. 10b can be constituted and the manufacture of a superconductive magnetic memory utilizing the above-described characteristic. The read-out of the superconductive magnetic memory can be made easily by utilizing the fact that the magnetic field immediately above the film surface varies greatly with magnetic detectors such as magnetic heads and Hall element heads.

Furthermore, there is a method for writing into the superconductive magnetic memory which is so arranged that a perfectly diamagnetic state under a constant magnetic field is made to correspond to 1 and a minutely diamagnetic state intruded on by flux is made to correspond to 0, and after setting all memory bits at 0 in advance, 0 bits are made by introducing flux into a portion of memory bits through application of pulse magnetic field. Here, changing from 0 to 1 is effected by heating above the transition temperature with laser pulses, etc. and after cooling in the zero magnetic field, applying the external magnetic field again. The inventors of the present invention confirmed that these superconductive magnetic memories are small in the time-dependent change and very stable from the time viewpoint. The effect of the crystallization reduction processing on this superconductor thin film is the same whether it is a p-type superconductor or n-type superconductor.

Concrete Embodiment 4

Figure 11:
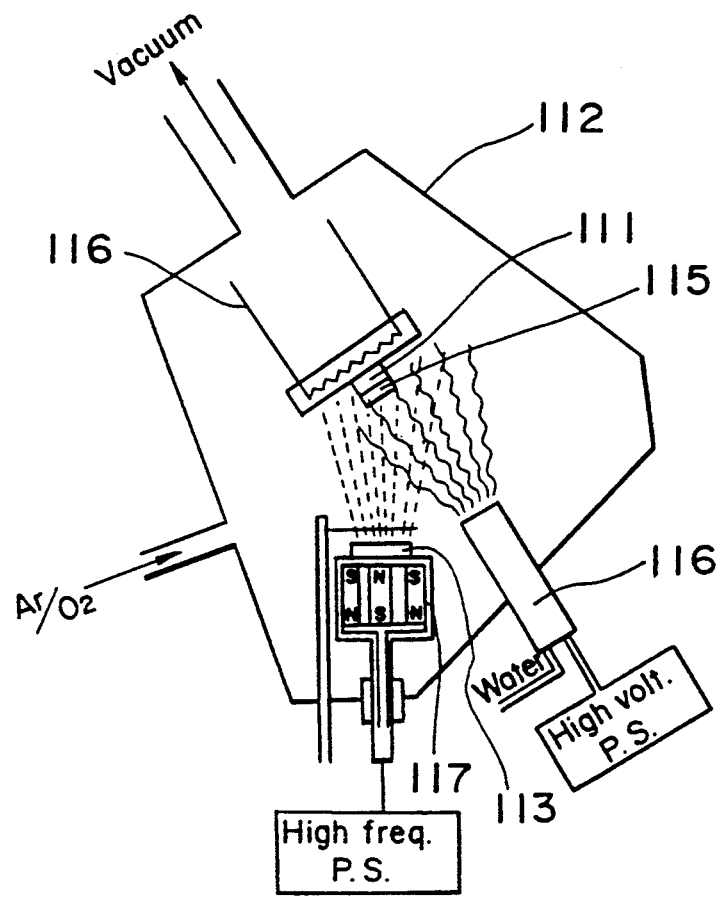
FIG. 11 is a schematical sectional view showing the basic constitution of the manufacturing device for superconductor thin film according to a preferred embodiment of the present invention.

By using a formation device shown in FIG. 11, using magnesium oxide single crystal (100) face as the substrate 111 and sputter vapor-depositing the target 112 formed of oxide high temperature superconductor material sintered by high frequency planar magnetron sputtering method in the atmosphere of Ar and $O_2$ mixture gas, a crystal y-Ba-Cu-O thin film 115 was deposited on the substrate 111 heated by a substrate heating 16. In this case, the processing condition was a gas pressure of 0.4 Pa, sputtering electric power of 160 W, sputtering time of 1 hour, thin film thickness of 0.5 $\mu$m and substrate temperature of 600° C. The crystallinity improvement processing was conducted by X-ray irradiation using an Rh bulb, and the oxidization processing was conducted by introducing oxygen gas into the formation tank 112 immediately after formation of superconductor thin film 115, as is clear from the magnetic field characteristic curve in FIG. 10a, in the superconductor thin film not subjected to the crystallization reduction processing in the present invention, diamagnetism slowly changes and the flux intrudes slowly. However, in the superconductor thin film subjected to said processing, at T=48 K., magnetization increases almost linearly up to H=200 Oe, and thereafter shows maximum magnetization 1000 Oemu/cc at H=400 Oe. When magnetic field is further strengthened, flux intrudes into the superconductor thin film, resulting in the drop of magnetization value to about one to several tenths. When sample of about 1 mm outside diameter is measured with Hall element for low temperature use, at T=48 K., H=4000 e at diamagnetic state (M=1000

Oemu/cc) and H=200 Oe at flux intrusion state, and the diamagnetic state has a much larger surface magnetic field as compared with the flux intrusion state and this difference can be detected easily.

Preferred Embodiment 5

A superconductor thin film is formed on the substrate by the sputtering method, and by heat treating in the oxygen atmosphere or by irradiation oxygen ions or neutral oxygen atoms in the excited state, superconductivity is generated. Furthermore, by irradiating X-rays or ultraviolet rays into a part of said superconductor thin film, a weak coupling portion is formed. However, the inventors of the present invention confirmed that this weak coupled potion shows any one of ordinary conductor, semiconductor or insulator, depending on the irradiation amount of X-rays or ultraviolet rays. In this case, when there are two superconductor electrodes, that is, it is a two-terminal element, the weak junction portion becomes a Tunnel type Josephson element. It is confirmed by the inventors of the present invention that this thin film formation is not limited to the physical vapor phase growth method, chemical vapor phase growth method, for example, atmospheric or decompression chemical vapor phase growth method, plasma chemical vapor phase growth method, photo-chemical vapor phase growth method are effective when the composition is conformed. It was further found by them that when the superconductivity obtained by oxygen processing these thin films is controlled by irradiation of X-rays or ultraviolet rays, these superconductor thin films show the property of ordinary conductors, semiconductors or insulators. Said X-ray or ultraviolet ray irradiation processing is conducted by using ordinary X-ray bulb of W, Mo, Rh, Cu, Fe, Co, Cr, Al, Mg, etc. or ultraviolet ray source of H, he, Ne, etc., and by irradiating X-rays or ultraviolet rays onto superconductor thin films. This effect is considered to be result from the fact that the thin film superconductor optimized to obtain superconductivity by the oxidization processing is reduced by irradiation of X-ray or ultraviolet ray, the optimum condition of oxygen for superconductivity is broken by control of the oxygen amount contained in the crystal, and the superconductor characteristics of the portion irradiated by X-rays or ultraviolet rays vanished.

Unlike the utilization of ion beams or electron beams, the utilization of X-rays or ultraviolet rays makes the homogeneous processing possible without causing change of ratio among metallic atoms, local great temperature rise and crystallinity deterioration of thin film, and therefore, the present invention has an advantage of causing no serious damage to the on thin film. Moreover, X-rays and ultraviolet rays are short in wavelength, minutely control area of superconductor thin film to be processed, and make possible the reduction processing of precise and minute cuprooxide thin film. Thereby, the preparation of devices such as Josephson element requiring sub-micron processing becomes easy by irradiation of X-rays or ultraviolet rays.

Preferred Embodiment 6

A preferred embodiment of the present invention will be described with reference to the accompanying drawings.

Figure 12:
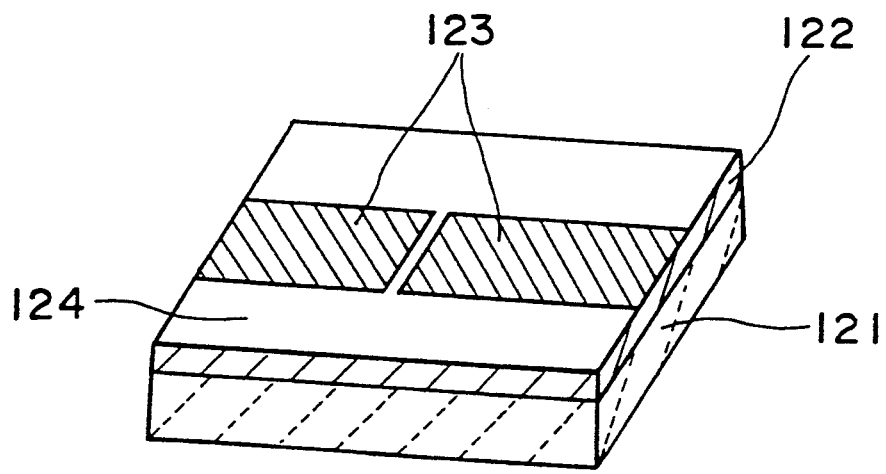
FIG. 12 is a schematic perspective view for showing a manufacturing method of Josephson devices according to a preferred embodiment of the present invention.

In FIG. 12, a superconductor thin film 122 is formed on a substrate 121, for example, by the sputtering method. Furthermore, by conducting heat treatment in the oxygen atmosphere in accordance with the needs, or irradiating oxygen ions or neutral oxygen atoms in the excited state, superconductivity is obtained. Further, by irradiating photons having energy larger than ultraviolet ray on the thin film 122 surface, and thereafter by selectively conducting oxidization processing, two electrode portions 123 separated by a gap portion 124 are formed. As the method for said oxidization processing, irradiation of at least oxygen ions generated by discharging of an oxygen containing gas or neutral oxygen atoms in the excited state, or treatment in the ozone containing gas were found to be effective and easy. These two oxidization processes both do not require heating samples, and besides, the former has an advantage of completing the processing in a comparatively short time, while the latter has an advantage that since organic materials represented by resist are little impaired, an ordinary resist film may be used for the mask in the oxidization processing. It was further confirmed by the inventors of the present invention that the electrode portions 123 have superconductivity in the thin film 122, and portion including the gap portion 124 other than electrode portions 123 is of an ordinary conductor, semiconductor, or insulator, because no photons are irradiated or no oxidization processing is conducted thereon. In this case, the gap portion 124 becomes a weak coupling or a tunnel junction, and if it is a two-terminal element, it becomes a Josephson element.

Figure 13:
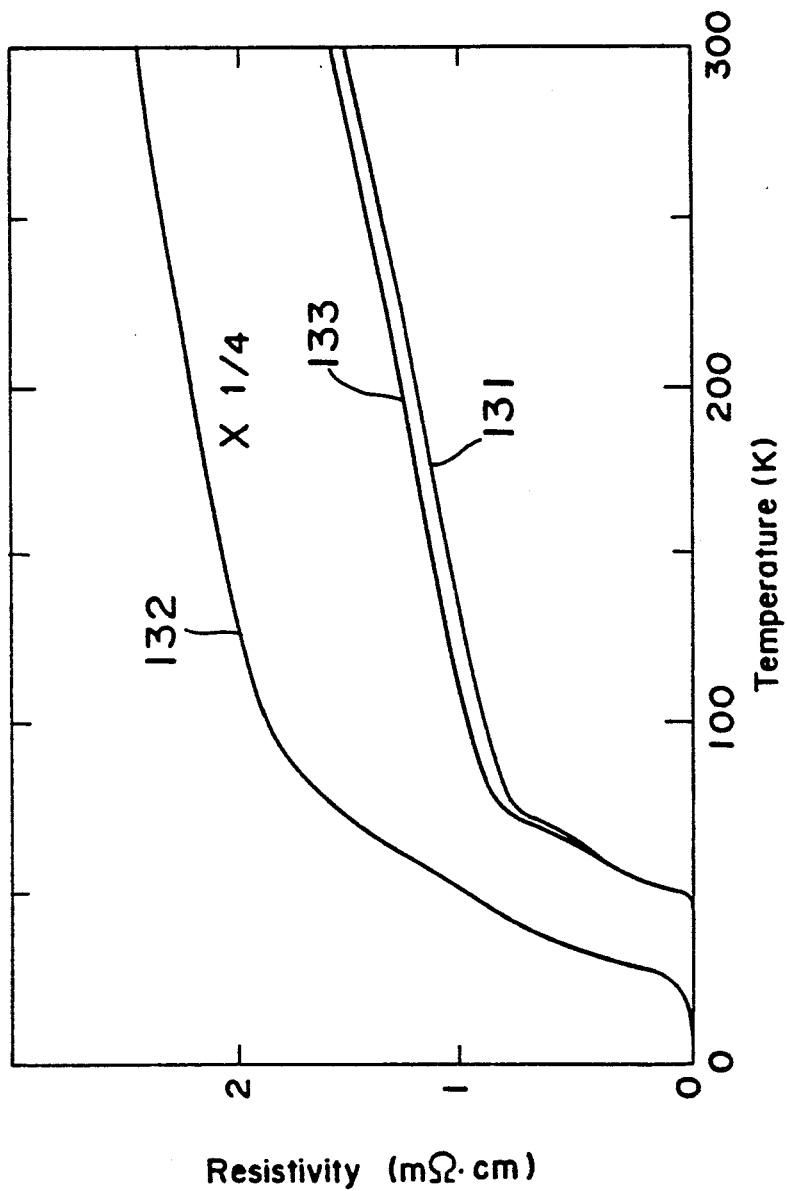
FIG. 13 is a graph showing the temperature change of resistivity of superconductor thin film after irradiation of photons having energy larger than ultraviolet ray immediately after preparation thereof and after the oxidization processing.

The inventors of the present invention found that as described above, by irradiating X-rays, ultraviolet rays or photons having larger energy than ultraviolet rays onto a superconductor thin film, this superconductor thin film can be controlled so as to show the property of an ordinary conductor, semiconductor or insulator. As photons of wavelength shorter than ultraviolet rays, radiation light from ordinary X-ray bulbs such as W, Mo, R, Cu, Fe, Co, Ct, Al, Mg, Zr, an ultraviolet ray source such as H, He, Ne, etc. or mercury lamp, or $\gamma$ rays radiating from radiative elements by $\gamma$ disintegration may be used. FIG. 13 shows an example of the result of the basic experiment for confirmation of this characteristic, and taking Bi-Sr-Ca-Cu-O superconductor thin film, there are shown the measured temperature change of resistivity conducted in the three conditions of immediately after preparation of film (131), after ultraviolet ray irradiation for three hours (132), and after the oxidization processing conducted, thereafter. Though superconductivity was shown at about 45K immediately after preparation of thin film (131), the resistivity at the room temperature increased about 8 times after irradiation so as to show now superconductivity (132), but the characteristic immediately after preparation was almost recovered by the oxidization processing. This result shows that irradiation reduces the thin film and causes superconductivity vanish but the characteristic can be reversibly recovered by the oxidization processing.

Concrete Embodiment 6

By using (100) face MgO single crystal as as substrate an by sputter vapor-depositing $YBa_2Cu_{4.6}O_m$ target sintered by high frequency planar magnetron sputtering method in the atmosphere of Ar and oxygen mixture gas, crystal $YBa_2Cu_3O_7$ thin film was deposited on said substrate.

In this case, the processing condition was a gas pressure of 0.5 Pa, sputtering electric power of 150 W, sputtering time of 20 minutes, thin film thickness of 0.2 μm, and a substrate temperature of 700° C. The thin film thus obained showed superconductivity and the transition temperature was 90K.

Although the thickness of thin film 122 was 0.2 μm in the present invention, it was confirmed that superconductivity is generated in the case of a thin film of less than 0.1 μm thickness or in the case of thin film of more than 10 μm thickness.

Figure 14:
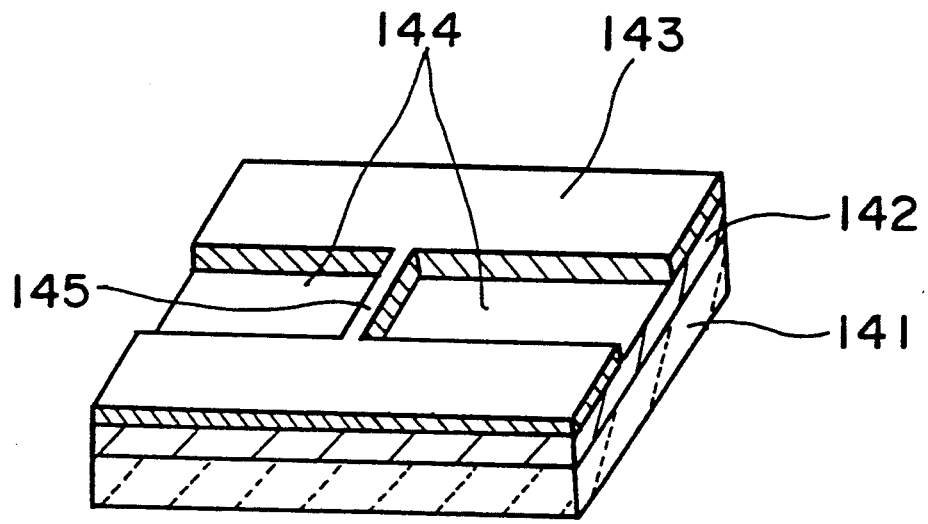
FIG. 14 is a schematic perspective view for showing one of process among the manufacturing methods for Josephson devices according to a preferred embodiment of the present invention.

Furthermore, by irradiating ultraviolet rays on this superconductive thin film 122 for about 3 hours with a low tension mercury lamp, said film 122 was reduced so as to cause superconductivity to vanish. And, after forming a mask pattern on the superconductor thin film 142 by using resist film 143 as shown in FIG. 14, said superconductor thin film 143 was left for several hours in the oxygen atmosphere containing several percent of ozone by utilizing an ozone generator, and the oxidization processing was conducted on the portion not covered by resist film 143 in the surface of superconductor thin film 142 so as to form electrode portions there.

Finally, the resist film 143 was removed with organic solvent, measuring terminals were bonded to two electrode portions with conductive paste, a alternating voltage of 85 Hz was applied to these terminals, and through these terminals, the relationship with the current flowing through the gap portion was observed. As a result, the observed current-voltage characteristic had a non-linearity characteristic of Josephson elements. Furthermore, when microwaves of 20 Ghz were irradiated on this gap portion 145, a step of voltage was observed on the current-voltage characteristic curve, and from the relationship between the position of this step and microwave frequency, this step was found to be a so-called Shappiro step characteristic of the Josephson junction. From these results, it was found that a SNS type (superconductor-normal conductor-superconductor) Josephson junction was formed in the trial manufacture element.

By this method, it was possible to form a Josephson element of good controllability and weak coupling. In this case, as resist, PMMA for electron beams which can be developed with organic solvent only or negative resist and the like are suitable. Usually, many of these resists are changed in quality when heated above 200° C., and can not display the function as a resist, but the oxidization method according to the present invention is effective in that it neither hurts the resist nor raises the substrate temperature.

Preferred Embodiment 7

By forming superconductor thin film on the substrate by the sputtering method, and by conducting heat-treatment in the oxygen atmosphere or irradiating oxygen ions or neutral oxygen atoms in the excited state as needed, superconductivity is obtained. Next, photons having an energy larger than ultraviolet rays are selectively irradiated on two electrode portions separated by a minute gap portion on the thin film surface. And simultaneously with the irradiation or thereafter, an oxidization processing is conducted on the thin film surface. It was confirmed that the portion not subjected to photon irraadiation by this method is inferior in superconductive characteristics as compared with the electrode portions irradiated with photons, and by controlling the condition of the irradiation and the oxidization processing, a weak coupling type Josephson junction is made. According to the manufacturing method of the present invention, since no selective oxidization processing is required but the oxidization processing all over the sample is possible, it is not necessary to use masks of such as resist film which is easily eroded by oxygen plasma in the oxidization processing. Therefore, there is an advantage that the oxidization processing can be made by using oxygen plasma capable of conducting said processing in a short time. Furthermore, it is not always necessary to use a resist for a mask and by the usual technique of photo-lithography, for example, by bringing the usual photomask made by forming patterned thin film of chromium a glass plate into contact with superconductor thin film and by irradiating through this mask, it is possible to irradiate photons selectively on the electrode portions.

Preferred Embodiment 8

A superconductor thin film is formed on a substrate by the sputtering method and by conducting heat treatment or by irradiating oxygen ions or neutral oxygen atoms in the excited state as needed, super conductivity is obtained. Next, photons having an energy larger than ultraviolet rays are selectively irradiated on the two electrode portions separated by a minute gap portion on the thin film. And simultaneously with said irradiation or thereafter, an oxidization processing is conducted selectively on said electrode portions. It was confirmed that the gap portion not subjected photon irradiation by this method is inferior in superconductor characteristics as compared with the electrode portions irradiated with photons, and by controlling the condition of irradiation and oxidization processing, it becomes a weak coupling type Josephson junction. Since portions other than the electrode portions are not subjected to photon irradiation or oxidization processing according to the present manufacturaing method, in the case of integrating other functional elements on the same substrate, the present manufacturing method has an advantage of not adversely affecting these functional elements.

Since the irradiation of photons having energy larger than ultraviolet rays finely controls, because of the short wavelength of photons, the area of superconductor thin film to be processed and with fine precision, allows the reduction processing of superconductor thin films, the preparation of devices such as Josephson devices requiring sub-micron processing is easily made by irradiation of photons.

Preferred Embodiment 9

A preferred embodiment of the present invention will be described with reference to the accompanying drawings.

Figure 15:
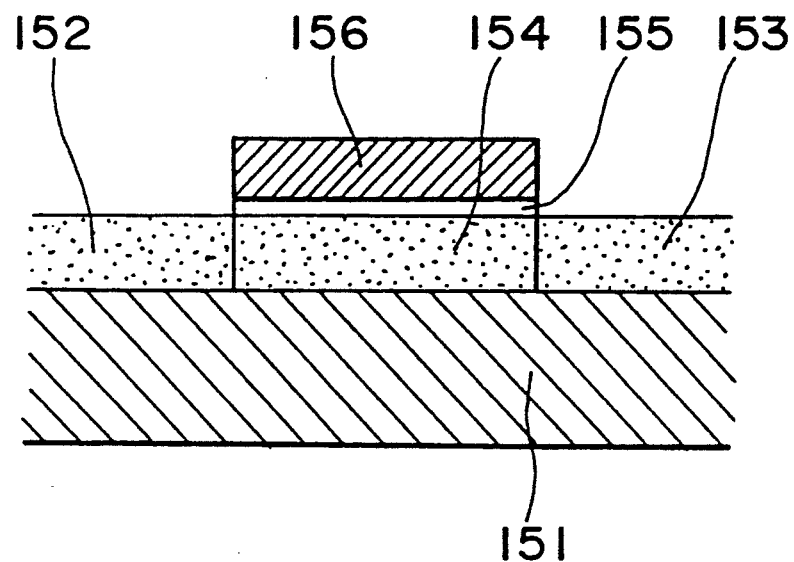
FIG. 15 is a sectional view showing the basic constitution of the superconductive transistor according to a preferred embodiment of the present invention.

FIG. 15 is a basic constitution sectional view of a superconductor thin film transistor according to a preferred embodiment of the present invention, and FIG. 16 is a sectional process drawing showing the manufacturing method for the superconductor thin film transistor according to the present invention. In FIG. 15, on the substrate 151, there are formed a superconductive source area 152 and a superconductive drain area 153, each constituted of material made of oxide thin film represented by A-B-Cu-O, and improved in crystallinity over said channel layer by irradiation of photons having shorter wavelength than ultraviolet ray. and on the same substrate, there is formed so as to contact these areas a channel layer thin film 154 made of oxide thin film composed of the same constituent elements. Here, A designates at least one kind of element among Bi, Tl, Pb, Y and lanthanide series elements (elements of atomic number 57 through 71, however excluding those of Nos. 58, 59 and 61), and B designates at least one kind of elements among elements of 2a group. On the channel layer 154, there are further formed a gate insulating film 155 and on top thereof a gate electrode 156. The superconductor transistor according to the present invention is an element of extremely short wavelength of about 0.1 μm, and for manufacture of this element, the following method is very effective.

The inventors of the present invention discovered that by irradiation of photons having energy larger than ultraviolet rays, the crystallinity of such a oxide superconductor thin film is improved, and further confirmed the rise of the critical temperature and improvement of critical current density by combining the oxidization processing therewith. By this and by using the gate electrode as the mask for photons, a self-alignment process applicable to a minute gate electrode structure was invented.

With reference to FIG. 16, a preferred embodiment of the manufacturing method for the superconductor transistor according to the present invention will be described. By using oxide magnesium single crystal (100) face as the substrate 161, and by sputter vapor-depositing target formed of high temperature superconductor sintered by the high frequency planar magnetron sputtering method in the atmosphere of Ar and oxygen mixture gas, oxide thin film 168 was deposited on said substrate as crystal Y-Ba-Cu-O thin film (FIG. 16a). In this case, the processing conditions were: a gas pressure of 0.4 Pa, sputtering electric power of 100 W, sputtering time of 10 minutes, thin film film thickness of 50 nm, and substrate temperature of 600° C. Next, all over the surface of the oxide thin film 168, gate insulation film 165 and gate electrode 166 were formed by sputtering vapor deposition. As a gate insulation film, a zirconium film of 20 nm thickness was used and as gate electrode 166, Pt of 20 nm thickness was used, This was etched by the photoprocess and Ar ion etching technique until the surface of the oxide thin film 168 is exposed with only the gate eletrode portion being left (FIG. 16b). The gate electrode length was set at 0.2 μm and the width thereof was set at 5 mm. Thereafter, the surface of the oxide thin film 168 is subjected to the oxidization processing after or during irradiation of photons 167 having energy larger than ultraviolet ray, for example, X-ray. As a result, the gate electrode 166 becoming the mask for photons 167, the oxide thin film 168 under the gate electrode 166 becomes a channel layer thin film 164 showing semiconductive resistance or a weak superconductive characteristic. Also, the oxide thin film 168 having no gate electrode thereabove is improved of in crystallinity by irradiation of photons 167 and becomes a superconductor thin film of high critical temperature and large critical current density and forms respectively the source area 162 and drain area 163, and thus the element is completed. For X-ray irradiation, the X-ray source using Rh bulb is used, and as the method of the oxidization processing, the heat treatment at 200° C. to 800° C. in the oxygen atmosphere or irradiation of oxygen plasma are effective. An example of the processing condition is microwave power of 200 W, oxygen gas pressure of $8.5 \times 10$ H-4 Y Torr., and bias voltage of 50 V. It was confirmed that the prepared element obtained a critical current of 10 μA at 4.2K and by applying 20 V voltage between gate and source, said current dropped to 5 μA and by the electric field, the control of superconductive current is possible.

It is to be noted here that although magnesium oxide was used for substrate in the present embodiment, the present invention is not limited to this, and any material may be applicable so long as it has a similar function. Furthermore, although Y-Ba-Cu-O was used as the material for oxide thin film 168, it is not limited to the material but any material may be used so long as it is such material as described in the foregoing embodiment. Moreover, zirconium oxide was used for material of gate insulating film, it is not limited to this material but any material having similar function may be used. Furthermore, although Pt was used for gate electrode material, it is not limited to this material but any material having similar function may be applicable.

EFFECT OF THE INVENTION

Since a process for insuring the reliability and long range stability of the element using high temperature superconductor is provided by the present invention, the present invention has an extremely great value from the industrial viewpoint. Since the superconductor thin film is homogeneous and of thin film single crystal, as compared with conventional sintered body, it becomes possible to realize superconductor elements of extremely high accuracy by the present invention. It has a great feature in providing an efficient and easy process for crystallinity improvement processing and oxidization processing for a P-type superconductor. Also, by the present invention, a process for insuring the reliability and long range stability of the elements using an N-type thin film superconductor is provided. It has an excellent feature in providing a process for crystallinity improvement processing and oxidization processing for an N-type superconductor.

In the foregoing preferred embodiments, high temperature superconductor including cupro-oxide was described, the effect of the present invention is effective with any high temperature superconductor wherein oxygen deficiency is generated by photon irradiation. Therefore, the present invention is effective even for materials not containing copper, for example, BKB (Ba-K-Bi-O) series material. Since in a sulphur compound wherein oxygen was replaced by sulphur, sulphur efficiency is generated by photon irradiation, the effect of the present invention is similarly expected in Chevrel compounds.

From the fact that the current density in the superconductive state is small and the time-dependent logarithmic decrease of current density is remarkable, it has been thus far considered difficult to realize a superconductor device of high reliability. However, by dint of the present invention, it has become possible to control on the atomic scale and introduce an effective pinning center for fluxoid quantum lines composed of oxygen deficiency and it was made possible to improve the critical current density and at the same time to increase the activation energy of flux creep. This has provided a base for realizing superconductor devices of high stability and reliability with a high temperature superconductor.

By the crystallization and reduction processing through irradiation of photons having energy larger than ultraviolet rays effected during formation of thin film of the present invention or thereafter, it is possible to realize a high temperature superconductor thin film of strengthened flux pinning force and superconductive magnetic memory of excellent memory retaining characteristic using the superconductor thus prepared.

The manufacturing method for thin film superconductor elements according to the present invention has a great feature in that photons having energy larger than ultraviolet ray are irradiated partially on the homogeneous superconductor formed as a thin film. The reduction processing for a cupro-oxide thin film by photon irradiation does not a temperature rise of the thin film, has a good controllability and is simple to process. Therefore, a homogeneous superconductor element with a high accuracy weak coupling portion is easily realized by the present invention.

The manufacturing method for Josephson elements according to the present invention is greatly characterized by the fact that photons having energy larger than ultraviolet rays are irradiated on a homogeneous superconductor formed as a thin film and the oxidization processing is conducted thereon. The processing of the superconductor thin film does not cause a temperature rise of the thin film, is excellent in controllability and is simple to handle. Therefore, homogeneous Josephson elements having a high accuracy weak coupling portion can be easily realized. Furthermore, the integration with devices, for example, of Si or GaAs becomes possible. The manufacturing method for Josephson elements according to the present invention may be practically applicable to the manufacture of various superconductive devices such as SQUID. Moreover, the present invention provides a superconductor transistor using high temperature superconductor thin film of extremely good characteristics. By practicing the present invention, a process which insures the reliability and long range stability of the superconductor transistor using a high temperature superconductor and facilitates the manufacture thereof is provided, by the present invention. A superconductor transistor of very high accuracy can be realized.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A method for manufacturing a thin film P-type oxide superconductor element which comprises:

providing an oxide superconductor thin film in which a critical current density obtained from a magnitude of diamagnetization measured at 48 K. in an outer magnetic field of 150 Oe is more than 3 mill.A/cm$^2$ and the critical current density obtained from a transport current measured at 48 K. in a null magnetic field is more than 3 mill.A/cm$^2$ by forming an oxide superconductor thin film on a substrate and irradiating said oxide superconductor thin film with photons having energies larger than that of ultraviolet rays and forming a weak coupling portion on said thin film oxide superconductor by irradiating photons having energies larger than that of ultraviolet rays onto a minute portion of said thin film to form a structure wherein said thin film oxide superconductor is divided into at least two regions by said weak coupling portion.

2. A method for manufacturing a Josephson device which comprises:

providing a P-type oxide superconductor thin film in which a critical current density obtained froom a magnitude of diamagnetization measured at 48 K. in an outer magnetic field of 150 Oe is more than 3 mill.A/cm$^2$ and a critical current density obtained from the transport current measured at 48 K. in a null magnetic field is more than 3 mill.A/cm$^2$ by forming a thin film oxide superconductor on a substrate and irradiating said thin film with photons having energies larger than that of ultraviolet rays, and selectively oxidizing two regions on said thin film oxide superconductor which are separated by a minute gap portion to form a junction portion in said oxide superconductor thin film.

3. The method for manufacturing a Josephson device in accordance with claim 2 which comprises using a mask pattern for forming said junction portion, and employing as said mask pattern an electron beam resist made of an acrylic resin or styrene resin or a negative resist for optolithography.

4. The method for manufacturing a Josephson device according to claim 2 wherein said oxidating step is performed by irradiation of oxygen ions or quasi-stabilized oxygen atoms is an excited state.

5. The method for manufacturing a Josephson device in accordance with claim 2 wherein said oxidizing step is performed using a gas containing ozone.

6. A method for manufacturing a Josephson device which comprises selectively irradiating photons having energies larger than that of ultraviolet rays only onto two regions which are separated by a minute gap portion of P-type thin film oxide superconductor in which a critical current density obtained froim a magnitude of diamagnetization measured at 48 K. in an outer magnetic field of 150 Oe is more than 3 mill.A/cm$^2$ and a critical current density obtained from the transport current measured at 48 K. in a null magnetic field is more than 3 mill.A/cm$^2$ by forming a thin film oxide superconductor on a substrate and irradiating said thin film with photons having energies larger than that of ultraviolet rays, and oxidizing a surface of the oxide superconductor thin film during said irradiating step or after said irradiating.

7. A method for manufacturing an oxide superconductor transistor, the oxide superconductor transistor including a gate electrode formed on a surface of a channel region with a gate insulating film interposed therebetween, and a superconductor source region and a superconductor drain region each comprising a strong superconductor in which a critical current density obtained from a magnitude of diamagnetization measured at 48 K. in an outer magnetic field of 150 Oe is more than 3 mill.A/cm$^2$ and the critical current density obtained from a transport current measured at 48 K. in a null magnetic field is more than 3 mill.A/cm$^2$, said method comprising:

forming an oxide superconductor thin film on a substrate, forming a gate isulating film and a gate electrode on a surface portion of said oxide superconductor thin film corresponding to said channel region, and irradiating photons having energies larger than that of ultraviolet rays onto said oxide superconductor thin film using said gate electrode as a mask and oxidizing said superconductor thin film during or after said irradiating step, thereby improving crystallinity in the superconductor source area and superconductor drain area and concurrently forming the channel layer.

8. The method for manufacturing an oxide superconductor transistor in accordance with claim 7, comprising forming the gate electrode of a metal or a silicide.

9. A method for manufacturing an oxide superconductor magnetic memory which is capable of distinguishing memory states responsive to an absolute value of magnetization and which includes at least one strong superconductor in which the critical current density obtained from a magnitude of diamagnetization measured at 48 K. in an outer magnetic field of 150 Oe is more than 3 mill.A/cm$^2$ and a critical current density obtained from the transport current measured at 48 K in a null magnetic field is more than 3 mill.A/cm$^2$ and at least one weak superconductor having a critical current density smaller than that of said strong superconductor, said method comprising preparing said strong superconductor by irradiating a thin film oxide superconductor with photons having energies larger than that of ultraviolet rays accompanied by oxidation, and preparing said weak superconductor by only irradiating the thin film oxide superconductor with photons having energies larger that that of ultraviolet rays.

* * * * *

UNITED STATES PATENT AND TRADEMARK OFFICE
CERTIFICATE OF CORRECTION

PATENT NO. : 5,145,830
DATED : September 8, 1992
INVENTOR(S) : Shigemi KOHIKI

It is certified that error appears in the above-identified patent and that said Letters Patent is hereby corrected as shown below:

Title page, item [22] Filed: change

August 21, 1991 to --August 21, 1990--.

Signed and Sealed this

Fourteenth Day of September, 1993

*Attest:*

BRUCE LEHMAN

*Attesting Officer*     *Commissioner of Patents and Trademarks*